US012755788B2

(12) United States Patent
Tran

(10) Patent No.: US 12,755,788 B2
(45) Date of Patent: Oct. 6, 2026

(54) ADDRESS FAULT DETECTION IN A MEMORY SYSTEM

(71) Applicant: Silicon Storage Technology, Inc., San Jose, CA (US)

(72) Inventor: Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 509 days.

(21) Appl. No.: 17/588,198

(22) Filed: Jan. 28, 2022

(65) Prior Publication Data

US 2023/0162794 A1 May 25, 2023

Related U.S. Application Data

(60) Provisional application No. 63/281,868, filed on Nov. 22, 2021.

(51) Int. Cl.
*G11C 16/08* (2006.01)
*G11C 16/04* (2006.01)
*G11C 16/26* (2006.01)
*H10B 41/30* (2023.01)

(52) U.S. Cl.
CPC .......... *G11C 16/08* (2013.01); *G11C 16/0425* (2013.01); *G11C 16/26* (2013.01); *H10B 41/30* (2023.02)

(58) Field of Classification Search
CPC ..... G11C 16/08; G11C 16/0425; G11C 16/26; G11C 27/005; G11C 2029/1202; G11C 8/10; G11C 29/024; G11C 29/24; G11C 29/025; H10B 41/30
USPC .................................................... 365/185.21
See application file for complete search history.

(56) References Cited

U.S. PATENT DOCUMENTS 7,868,375 B2 1/2011 Liu et al.
9,218,874 B1 * 12/2015 Koh ........................ G11C 16/10
10,431,265 B2 * 10/2019 Tran ........................ H10B 41/30
10,534,554 B2 * 1/2020 Tran ........................ G06F 3/0622
10,692,548 B2 * 6/2020 Tran ........................ G11C 16/08
11,393,532 B2 * 7/2022 Roy ........................ G11C 16/08
11,521,697 B2 * 12/2022 Kumar .................... G11C 29/44
2010/0107006 A1 4/2010 Fey
2015/0243368 A1 8/2015 Remington
(Continued)

FOREIGN PATENT DOCUMENTS

TW I 569273 B 2/2017
TW 201923771 A 6/2019

OTHER PUBLICATIONS

PCT Search Report and Written Opinion dated Aug. 11, 2022 corresponding to the related PCT Patent Application No. US 2022/014800.

(Continued)

*Primary Examiner* — Jay W. Radke
(74) *Attorney, Agent, or Firm* — Vedder Price P.C.

(57) ABSTRACT

Various examples of memory systems comprising an address fault detection system are disclosed. The memory system comprises a first memory array, a row decoder, and an address fault detection system comprising a second array, wherein the row decoder decodes row addresses into word lines, each word line coupled to a row of cells in the first array and a row of cells in the second array. The second array contains digital bits and/or analog values that are used to identify address faults.

16 Claims, 43 Drawing Sheets

(56) References Cited

U.S. PATENT DOCUMENTS

| | | | | |
|---|---|---|---|---|
| 2018/0277174 | A1* | 9/2018 | Tran | H01L 29/40114 |
| 2019/0114097 | A1* | 4/2019 | Tran | G06F 3/0622 |
| 2020/0110659 | A1 | 4/2020 | Foley | |
| 2020/0342940 | A1 | 10/2020 | Roy | |

OTHER PUBLICATIONS

Taiwanese Office Action mailed on Oct. 16, 2023 corresponding to the related Taiwanese Patent Application No. 111139748.

Taiwanese Office Action mailed on Feb. 16, 2024 corresponding to the related Taiwanese Patent Application No. 111139748.

S. Korean Office Action mailed on Jan. 7, 2025 corresponding to the related S. Korean Patent Application No. 10-2024-7012970.

Office Action from the European Patent Office, Aug. 6, 2025, filed under European Patent Application No. 22704839.4, 6 pages.

* cited by examiner

Address Fault Type 1: Wrong Row Selected

Address Fault Type 2: Multiple Rows Selected

Address Fault Type 1: Wrong Row Selected

Address Fault Type 2: Multiple Rows Selected

FIGURE 12 (PRIOR ART)

| Address In A[3:0] | | | | | Encoded Address Bits EB[3:0] | | | |
|---|---|---|---|---|---|---|---|---|
| A3 | A2 | A1 | A0 | | EA3 | EA2 | EA1 | EA0 |
| 0 | 0 | 0 | 0 | | 0 | 0 | 0 | 0 |
| 0 | 0 | 0 | 1 | | 0 | 0 | 0 | 1 |
| 0 | 0 | 1 | 0 | | 0 | 0 | 1 | 0 |
| 0 | 0 | 1 | 1 | | 0 | 0 | 1 | 1 |
| 0 | 1 | 0 | 0 | | 0 | 1 | 0 | 0 |
| 0 | 1 | 0 | 1 | | 0 | 1 | 0 | 1 |
| 0 | 1 | 1 | 0 | | 0 | 1 | 1 | 0 |
| 0 | 1 | 1 | 1 | | 0 | 1 | 1 | 1 |
| 1 | 0 | 0 | 0 | | 1 | 0 | 0 | 0 |
| 1 | 0 | 0 | 1 | | 1 | 0 | 0 | 1 |
| 1 | 0 | 1 | 0 | | 1 | 0 | 1 | 0 |
| 1 | 0 | 1 | 1 | | 1 | 0 | 1 | 1 |
| 1 | 1 | 0 | 0 | | 1 | 1 | 0 | 0 |
| 1 | 1 | 0 | 1 | | 1 | 1 | 0 | 1 |
| 1 | 1 | 1 | 0 | | 1 | 1 | 1 | 0 |
| 1 | 1 | 1 | 1 | | 1 | 1 | 1 | 1 |

FIGURE 13A

| Address In A[3:0] | | | | | Encoded Address Bits EB[3:0] | | | | |
|---|---|---|---|---|---|---|---|---|---|
| A3 | A2 | A1 | A0 | | EA3 | EA2 | EA1 | EA0 | PB |
| 0 | 0 | 0 | 0 | | 0 | 0 | 0 | 0 | 0 |
| 0 | 0 | 0 | 1 | | 0 | 0 | 0 | 1 | 0 |
| 0 | 0 | 1 | 0 | | 0 | 0 | 1 | 0 | 0 |
| 0 | 0 | 1 | 1 | | 0 | 0 | 1 | 1 | 0 |
| 0 | 1 | 0 | 0 | | 0 | 1 | 0 | 0 | 0 |
| 0 | 1 | 0 | 1 | | 0 | 1 | 0 | 1 | 0 |
| 0 | 1 | 1 | 0 | | 0 | 1 | 1 | 0 | 0 |
| 0 | 1 | 1 | 1 | | 1 | 0 | 0 | 0 | 1 |
| 1 | 0 | 0 | 0 | | 1 | 0 | 0 | 0 | 0 |
| 1 | 0 | 0 | 1 | | 1 | 0 | 0 | 1 | 0 |
| 1 | 0 | 1 | 0 | | 1 | 0 | 1 | 0 | 0 |
| 1 | 0 | 1 | 1 | | 1 | 0 | 1 | 1 | 1 |
| 1 | 1 | 0 | 0 | | 1 | 1 | 0 | 0 | 0 |
| 1 | 1 | 0 | 1 | | 0 | 0 | 1 | 0 | 1 |
| 1 | 1 | 1 | 0 | | 0 | 0 | 0 | 1 | 1 |
| 1 | 1 | 1 | 1 | | 0 | 0 | 0 | 0 | 1 |

FIGURE 13B

| Address In A[3:0] | | | | | Encoded Address Bits EB[3:0] | | | | | |
|---|---|---|---|---|---|---|---|---|---|---|
| A3 | A2 | A1 | A0 | | EA3 | EA2 | EA1 | EA0 | PB | MRD |
| 0 | 0 | 0 | 0 | | 0 | 0 | 0 | 0 | 0 | 1 |
| 0 | 0 | 0 | 1 | | 0 | 0 | 0 | 1 | 0 | 1 |
| 0 | 0 | 1 | 0 | | 0 | 0 | 1 | 0 | 0 | 1 |
| 0 | 0 | 1 | 1 | | 0 | 0 | 1 | 1 | 0 | 1 |
| 0 | 1 | 0 | 0 | | 0 | 1 | 0 | 0 | 0 | 1 |
| 0 | 1 | 0 | 1 | | 0 | 1 | 0 | 1 | 0 | 1 |
| 0 | 1 | 1 | 0 | | 0 | 1 | 1 | 0 | 0 | 1 |
| 0 | 1 | 1 | 1 | | 1 | 0 | 0 | 0 | 1 | 1 |
| 1 | 0 | 0 | 0 | | 1 | 0 | 0 | 0 | 0 | 1 |
| 1 | 0 | 0 | 1 | | 1 | 0 | 0 | 1 | 0 | 1 |
| 1 | 0 | 1 | 0 | | 1 | 0 | 1 | 0 | 0 | 1 |
| 1 | 0 | 1 | 1 | | 1 | 0 | 1 | 1 | 1 | 1 |
| 1 | 1 | 0 | 0 | | 1 | 1 | 0 | 0 | 0 | 1 |
| 1 | 1 | 0 | 1 | | 0 | 0 | 1 | 0 | 1 | 1 |
| 1 | 1 | 1 | 0 | | 0 | 0 | 0 | 1 | 1 | 1 |
| 1 | 1 | 1 | 1 | | 0 | 0 | 0 | 0 | 1 | 1 |

FIGURE 14

| Address in A[3:0] | | | | | Encoded Address Bits EA[3:0], EB[3:0] | | | | | | | |
|---|---|---|---|---|---|---|---|---|---|---|---|---|
| A3 | A2 | A1 | A0 | | EA3 | EB3 | EA2 | EB2 | EA1 | EB1 | EA0 | EB0 |
| 0 | 0 | 0 | 0 | | 0 | 1 | 0 | 1 | 0 | 1 | 0 | 1 |
| 0 | 0 | 0 | 1 | | 0 | 1 | 0 | 1 | 0 | 1 | 1 | 0 |
| 0 | 0 | 1 | 0 | | 0 | 1 | 0 | 1 | 1 | 0 | 0 | 1 |
| 0 | 0 | 1 | 1 | | 0 | 1 | 0 | 1 | 1 | 0 | 1 | 0 |
| 0 | 1 | 0 | 0 | | 0 | 1 | 1 | 0 | 0 | 1 | 0 | 1 |
| 0 | 1 | 0 | 1 | | 0 | 1 | 1 | 0 | 0 | 1 | 1 | 0 |
| 0 | 1 | 1 | 0 | | 0 | 1 | 1 | 0 | 1 | 0 | 0 | 1 |
| 0 | 1 | 1 | 1 | | 0 | 1 | 1 | 0 | 1 | 0 | 1 | 0 |
| 1 | 0 | 0 | 0 | | 1 | 0 | 0 | 1 | 0 | 1 | 0 | 1 |
| 1 | 0 | 0 | 1 | | 1 | 0 | 0 | 1 | 0 | 1 | 1 | 0 |
| 1 | 0 | 1 | 0 | | 1 | 0 | 0 | 1 | 1 | 0 | 0 | 1 |
| 1 | 0 | 1 | 1 | | 1 | 0 | 0 | 1 | 1 | 0 | 1 | 0 |
| 1 | 1 | 0 | 0 | | 1 | 0 | 1 | 0 | 0 | 1 | 0 | 1 |
| 1 | 1 | 0 | 1 | | 1 | 0 | 1 | 0 | 0 | 1 | 1 | 0 |
| 1 | 1 | 1 | 0 | | 1 | 0 | 1 | 0 | 1 | 0 | 0 | 1 |
| 1 | 1 | 1 | 1 | | 1 | 0 | 1 | 0 | 1 | 0 | 1 | 0 |

Address Fault Detection Circuit 1510

FIGURE 18

| | | | | | | | | | | | | | |
|---|---|---|---|---|---|---|---|---|---|---|---|---|---|
| | | | | AY[2] | AY[1] | AY[0] | | AYA[2] | AYB[2] | AYA[1] | AYB[1] | AYA[0] | AYB[0] |
| V<7:0> | WLY[0]= | | V[0] | 0 | 0 | 0 | | 0 | 1 | 0 | 1 | 0 | 1 |
| | WLY[1]= | | V[1] | 0 | 0 | 1 | | 0 | 1 | 0 | 1 | 1 | 0 |
| | WLY[2]= | | V[2] | 0 | 1 | 0 | | 0 | 1 | 1 | 0 | 0 | 1 |
| | WLY[3]= | | V[3] | 0 | 1 | 1 | | 0 | 1 | 1 | 0 | 1 | 0 |
| | WLY[4]= | | V[4] | 1 | 0 | 0 | | 1 | 0 | 0 | 1 | 0 | 1 |
| | WLY[5]= | | V[5] | 1 | 0 | 1 | | 1 | 0 | 0 | 1 | 1 | 0 |
| | WLY[6]= | | V[6] | 1 | 1 | 0 | | 1 | 0 | 1 | 0 | 0 | 1 |
| | WLY[7]= | | V[7] | 1 | 1 | 1 | | 1 | 0 | 1 | 0 | 1 | 0 |
| | | | | | | | | | | | | | |
| | | | | | | | | | | | | | |
| | | | | | AY[4] | AY[0] | | | | AYA[4] | AYB[4] | AYA[3] | AYB[3] |
| T<3:0> | WLY[8]= | | T[0] | | 0 | 0 | | | | 0 | 1 | 0 | 1 |
| | WLY[9]= | | T[1] | | 0 | 1 | | | | 0 | 1 | 1 | 0 |
| | WLY[10]= | | T[2] | | 1 | 0 | | | | 1 | 0 | 0 | 1 |
| | WLY[11]= | | T[3] | | 1 | 1 | | | | 1 | 0 | 1 | 0 |

FIGURE 23

| ROW# | Address in A[3:0] A3 | A2 | A1 | A0 | Encoded Pattern EA3 | EA2 | EA1 | EA0 |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 0 | 0 | 1 | 0 |
| 3 | 0 | 0 | 1 | 1 | 0 | 0 | 1 | 1 |
| 4 | 0 | 1 | 0 | 0 | 0 | 1 | 0 | 0 |
| 5 | 0 | 1 | 0 | 1 | 0 | 1 | 0 | 1 |
| 6 | 0 | 1 | 1 | 0 | 0 | 1 | 1 | 0 |
| 7 | 0 | 1 | 1 | 1 | 0 | 1 | 1 | 1 |
| 8 | 1 | 0 | 0 | 0 | 1 | 0 | 0 | 0 |
| 9 | 1 | 0 | 0 | 1 | 1 | 0 | 0 | 1 |
| 10 | 1 | 0 | 1 | 0 | 1 | 0 | 1 | 0 |
| 11 | 1 | 0 | 1 | 1 | 1 | 0 | 1 | 1 |
| 12 | 1 | 1 | 0 | 0 | 1 | 1 | 0 | 0 |
| 13 | 1 | 1 | 0 | 1 | 1 | 1 | 0 | 1 |
| 14 | 1 | 1 | 1 | 0 | 1 | 1 | 1 | 0 |
| 15 | 1 | 1 | 1 | 1 | 1 | 1 | 1 | 1 |

Assumes Row 6 and Row 7 are shorted:

| | | | | |
|---|---|---|---|---|
| MS SA outputs= | 0 | 2 | 2 | 1 |
| | | | | |
| Input Address= | 0 | 1 | 1 | 0 |
| | | | | |
| Hence fault address= | 0 | 1 | 1 | 1 |

FIGURE 24A

| Address in A[4:0] | | | | | | Encoded Pattern | | | | | | | | | |
|---|---|---|---|---|---|---|---|---|---|---|---|---|---|---|---|
| A4 | A3 | A2 | A1 | A0 | | ER0 | ER1 | ER2 | ER3 | ER4 | ER5 | ER6 | ER7 | ER8 | ER9 |
| 0 | 0 | 0 | 0 | 0 | | 1 | | | | 1 | | | | 1 | |
| 0 | 0 | 0 | 0 | 1 | | | 1 | | | 1 | | | | 1 | |
| 0 | 0 | 0 | 1 | 0 | | | | 1 | | 1 | | | | 1 | |
| 0 | 0 | 0 | 1 | 1 | | | | | 1 | 1 | | | | 1 | |
| 0 | 0 | 1 | 0 | 0 | | 1 | | | | | 1 | | | 1 | |
| 0 | 0 | 1 | 0 | 1 | | | 1 | | | | 1 | | | 1 | |
| 0 | 0 | 1 | 1 | 0 | | | | 1 | | | 1 | | | 1 | |
| 0 | 0 | 1 | 1 | 1 | | | | | 1 | | 1 | | | 1 | |
| 0 | 1 | 0 | 0 | 0 | | 1 | | | | | | 1 | | 1 | |
| 0 | 1 | 0 | 0 | 1 | | | 1 | | | | | 1 | | 1 | |
| 0 | 1 | 0 | 1 | 0 | | | | 1 | | | | 1 | | 1 | |
| 0 | 1 | 0 | 1 | 1 | | | | | 1 | | | 1 | | 1 | |
| 0 | 1 | 1 | 0 | 0 | | 1 | | | | | | | 1 | 1 | |
| 0 | 1 | 1 | 0 | 1 | | | 1 | | | | | | 1 | 1 | |
| 0 | 1 | 1 | 1 | 0 | | | | 1 | | | | | 1 | 1 | |
| 0 | 1 | 1 | 1 | 1 | | | | | 1 | | | | 1 | 1 | |
| 1 | 0 | 0 | 0 | 0 | | 1 | | | | 1 | | | | | 1 |
| 1 | 0 | 0 | 0 | 1 | | | 1 | | | 1 | | | | | 1 |
| 1 | 0 | 0 | 1 | 0 | | | | 1 | | 1 | | | | | 1 |
| 1 | 0 | 0 | 1 | 1 | | | | | 1 | 1 | | | | | 1 |
| 1 | 0 | 1 | 0 | 0 | | 1 | | | | | 1 | | | | 1 |
| 1 | 0 | 1 | 0 | 1 | | | 1 | | | | 1 | | | | 1 |
| 1 | 0 | 1 | 1 | 0 | | | | 1 | | | 1 | | | | 1 |
| 1 | 0 | 1 | 1 | 1 | | | | | 1 | | 1 | | | | 1 |
| 1 | 1 | 0 | 0 | 0 | | 1 | | | | | | 1 | | | 1 |
| 1 | 1 | 0 | 0 | 1 | | | 1 | | | | | 1 | | | 1 |
| 1 | 1 | 0 | 1 | 0 | | | | 1 | | | | 1 | | | 1 |
| 1 | 1 | 0 | 1 | 1 | | | | | 1 | | | 1 | | | 1 |
| 1 | 1 | 1 | 0 | 0 | | 1 | | | | | | | 1 | | 1 |
| 1 | 1 | 1 | 0 | 1 | | | 1 | | | | | | 1 | | 1 |
| 1 | 1 | 1 | 1 | 0 | | | | 1 | | | | | 1 | | 1 |
| 1 | 1 | 1 | 1 | 1 | | | | | 1 | | | | 1 | | 1 |

FIGURE 24B

| Address in A[4:0] | | | | | | Encoded Pattern | | | | | | | | | | | |
|---|---|---|---|---|---|---|---|---|---|---|---|---|---|---|---|---|---|
| A4 | A3 | A2 | A1 | A0 | | ER0 | ER1 | ER2 | ER3 | ER4 | ER5 | ER6 | ER7 | ER8 | ER9 | ER10 | ER11 |
| 0 | 0 | 0 | 0 | 0 | | 1 | | | | | | | | 1 | | | |
| 0 | 0 | 0 | 0 | 1 | | | 1 | | | | | | | 1 | | | |
| 0 | 0 | 0 | 1 | 0 | | | | 1 | | | | | | 1 | | | |
| 0 | 0 | 0 | 1 | 1 | | | | | 1 | | | | | 1 | | | |
| 0 | 0 | 1 | 0 | 0 | | | | | | 1 | | | | 1 | | | |
| 0 | 0 | 1 | 0 | 1 | | | | | | | 1 | | | 1 | | | |
| 0 | 0 | 1 | 1 | 0 | | | | | | | | 1 | | 1 | | | |
| 0 | 0 | 1 | 1 | 1 | | | | | | | | | 1 | 1 | | | |
| 0 | 1 | 0 | 0 | 0 | | 1 | | | | | | | | | 1 | | |
| 0 | 1 | 0 | 0 | 1 | | | 1 | | | | | | | | 1 | | |
| 0 | 1 | 0 | 1 | 0 | | | | 1 | | | | | | | 1 | | |
| 0 | 1 | 0 | 1 | 1 | | | | | 1 | | | | | | 1 | | |
| 0 | 1 | 1 | 0 | 0 | | | | | | 1 | | | | | 1 | | |
| 0 | 1 | 1 | 0 | 1 | | | | | | | 1 | | | | 1 | | |
| 0 | 1 | 1 | 1 | 0 | | | | | | | | 1 | | | 1 | | |
| 0 | 1 | 1 | 1 | 1 | | | | | | | | | 1 | | 1 | | |
| 1 | 0 | 0 | 0 | 0 | | 1 | | | | | | | | | | 1 | |
| 1 | 0 | 0 | 0 | 1 | | | 1 | | | | | | | | | 1 | |
| 1 | 0 | 0 | 1 | 0 | | | | 1 | | | | | | | | 1 | |
| 1 | 0 | 0 | 1 | 1 | | | | | 1 | | | | | | | 1 | |
| 1 | 0 | 1 | 0 | 0 | | | | | | 1 | | | | | | 1 | |
| 1 | 0 | 1 | 0 | 1 | | | | | | | 1 | | | | | 1 | |
| 1 | 0 | 1 | 1 | 0 | | | | | | | | 1 | | | | 1 | |
| 1 | 0 | 1 | 1 | 1 | | | | | | | | | 1 | | | 1 | |
| 1 | 1 | 0 | 0 | 0 | | 1 | | | | | | | | | | | 1 |
| 1 | 1 | 0 | 0 | 1 | | | 1 | | | | | | | | | | 1 |
| 1 | 1 | 0 | 1 | 0 | | | | 1 | | | | | | | | | 1 |
| 1 | 1 | 0 | 1 | 1 | | | | | 1 | | | | | | | | 1 |
| 1 | 1 | 1 | 0 | 0 | | | | | | 1 | | | | | | | 1 |
| 1 | 1 | 1 | 0 | 1 | | | | | | | 1 | | | | | | 1 |
| 1 | 1 | 1 | 1 | 0 | | | | | | | | 1 | | | | | 1 |
| 1 | 1 | 1 | 1 | 1 | | | | | | | | | 1 | | | | 1 |

FIGURE 25A

| Address in A[N:0] | | | | | | Encoded Pattern | | | | | | | |
|---|---|---|---|---|---|---|---|---|---|---|---|---|---|
| A4 | A3 | A2 | A1 | A0 | | ER0 | ER1 | ER2 | ER3 | EAR0 | EAR1 | EAR2 | EAR3 |
| 0 | 0 | 0 | 0 | 0 | | 1 | | | | 0.5X | | | |
| 0 | 0 | 0 | 0 | 1 | | | 1 | | | 0.5X | | | |
| 0 | 0 | 0 | 1 | 0 | | | | 1 | | 0.5X | | | |
| 0 | 0 | 0 | 1 | 1 | | | | | 1 | 0.5X | | | |
| 0 | 0 | 1 | 0 | 0 | | 1 | | | | 1.0X | | | |
| 0 | 0 | 1 | 0 | 1 | | | 1 | | | 1.0X | | | |
| 0 | 0 | 1 | 1 | 0 | | | | 1 | | 1.0X | | | |
| 0 | 0 | 1 | 1 | 1 | | | | | 1 | 1.0X | | | |
| 0 | 1 | 0 | 0 | 0 | | 1 | | | | | 0.5X | | |
| 0 | 1 | 0 | 0 | 1 | | | 1 | | | | 0.5X | | |
| 0 | 1 | 0 | 1 | 0 | | | | 1 | | | 0.5X | | |
| 0 | 1 | 0 | 1 | 1 | | | | | 1 | | 0.5X | | |
| 0 | 1 | 1 | 0 | 0 | | 1 | | | | | 1.0X | | |
| 0 | 1 | 1 | 0 | 1 | | | 1 | | | | 1.0X | | |
| 0 | 1 | 1 | 1 | 0 | | | | 1 | | | 1.0X | | |
| 0 | 1 | 1 | 1 | 1 | | | | | 1 | | 1.0X | | |
| 1 | 0 | 0 | 0 | 0 | | 1 | | | | | | 0.5X | |
| 1 | 0 | 0 | 0 | 1 | | | 1 | | | | | 0.5X | |
| 1 | 0 | 0 | 1 | 0 | | | | 1 | | | | 0.5X | |
| 1 | 0 | 0 | 1 | 1 | | | | | 1 | | | 0.5X | |
| 1 | 0 | 1 | 0 | 0 | | 1 | | | | | | 1.0X | |
| 1 | 0 | 1 | 0 | 1 | | | 1 | | | | | 1.0X | |
| 1 | 0 | 1 | 1 | 0 | | | | 1 | | | | 1.0X | |
| 1 | 0 | 1 | 1 | 1 | | | | | 1 | | | 1.0X | |
| 1 | 1 | 0 | 0 | 0 | | 1 | | | | | | | 0.5X |
| 1 | 1 | 0 | 0 | 1 | | | 1 | | | | | | 0.5X |
| 1 | 1 | 0 | 1 | 0 | | | | 1 | | | | | 0.5X |
| 1 | 1 | 0 | 1 | 1 | | | | | 1 | | | | 0.5X |
| 1 | 1 | 1 | 0 | 0 | | 1 | | | | | | | 1.0X |
| 1 | 1 | 1 | 0 | 1 | | | 1 | | | | | | 1.0X |
| 1 | 1 | 1 | 1 | 0 | | | | 1 | | | | | 1.0X |
| 1 | 1 | 1 | 1 | 1 | | | | | 1 | | | | 1.0X |

FIGURE 25B

| Address in A[N:0] | | | | | | Encoded Pattern | | | | | |
|---|---|---|---|---|---|---|---|---|---|---|---|
| A4 | A3 | A2 | A1 | A0 | | ER0 | ER1 | ER2 | ER3 | EAR0 | EAR1 |
| 0 | 0 | 0 | 0 | 0 | | 0.5X | | 0.5X | | | |
| 0 | 0 | 0 | 0 | 1 | | 1.0X | | 0.5X | | | |
| 0 | 0 | 0 | 1 | 0 | | | 0.5X | 0.5X | | | |
| 0 | 0 | 0 | 1 | 1 | | | 1.0X | 0.5X | | | |
| 0 | 0 | 1 | 0 | 0 | | 0.5X | | 1.0X | | | |
| 0 | 0 | 1 | 0 | 1 | | 1.0X | | 1.0X | | | |
| 0 | 0 | 1 | 1 | 0 | | | 0.5X | 1.0X | | | |
| 0 | 0 | 1 | 1 | 1 | | | 1.0X | 1.0X | | | |
| 0 | 1 | 0 | 0 | 0 | | 0.5X | | | 0.5X | | |
| 0 | 1 | 0 | 0 | 1 | | 1.0X | | | 0.5X | | |
| 0 | 1 | 0 | 1 | 0 | | | 0.5X | | 0.5X | | |
| 0 | 1 | 0 | 1 | 1 | | | 1.0X | | 0.5X | | |
| 0 | 1 | 1 | 0 | 0 | | 0.5X | | | 1.0X | | |
| 0 | 1 | 1 | 0 | 1 | | 1.0X | | | 1.0X | | |
| 0 | 1 | 1 | 1 | 0 | | | 0.5X | | 1.0X | | |
| 0 | 1 | 1 | 1 | 1 | | | 1.0X | | 1.0X | | |
| 1 | 0 | 0 | 0 | 0 | | 0.5X | | | | 0.5X | |
| 1 | 0 | 0 | 0 | 1 | | 1.0X | | | | 0.5X | |
| 1 | 0 | 0 | 1 | 0 | | | 0.5X | | | 0.5X | |
| 1 | 0 | 0 | 1 | 1 | | | 1.0X | | | 0.5X | |
| 1 | 0 | 1 | 0 | 0 | | 0.5X | | | | 1.0X | |
| 1 | 0 | 1 | 0 | 1 | | 1.0X | | | | 1.0X | |
| 1 | 0 | 1 | 1 | 0 | | | 0.5X | | | 1.0X | |
| 1 | 0 | 1 | 1 | 1 | | | 1.0X | | | 1.0X | |
| 1 | 1 | 0 | 0 | 0 | | 0.5X | | | | | 0.5X |
| 1 | 1 | 0 | 0 | 1 | | 1.0X | | | | | 0.5X |
| 1 | 1 | 0 | 1 | 0 | | | 0.5X | | | | 0.5X |
| 1 | 1 | 0 | 1 | 1 | | | 1.0X | | | | 0.5X |
| 1 | 1 | 1 | 0 | 0 | | 0.5X | | | | | 1.0X |
| 1 | 1 | 1 | 0 | 1 | | 1.0X | | | | | 1.0X |
| 1 | 1 | 1 | 1 | 0 | | | 0.5X | | | | 1.0X |
| 1 | 1 | 1 | 1 | 1 | | | 1.0X | | | | 1.0X |

3300

3600

3700 source line decoder
4000

ADDRESS FAULT DETECTION IN A MEMORY SYSTEM

PRIORITY CLAIM

This application claims priority to U.S. Provisional Patent Application No. 63/281,868, filed on Nov. 22, 2021, and titled, "Address Fault Detection in a Flash Memory System," which is incorporated by reference herein.

TECHNICAL FIELD

Various mechanisms are disclosed for performing address fault detection in a memory system.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volts. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a current sensing mode as following: A bias voltage is applied on bit line 20, a bias voltage is applied on word line 22, a bias voltage is applied on coupling gate 26, a bias or zero voltage is applied on erase gate 28, and a ground (i.e. a zero voltage) is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a reverse current sensing mode, in which bit line 20 is grounded and a bias voltage is applied on source line 24. In this mode the current reverses the direction from source line 14 to bitline 20.

Memory cell 10 alternatively can be read in a voltage sensing mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly >0V) on bit line 20 for an erased state and there is insignificant or close to zero output voltage on bit line 20 for a programmed state. Alternatively, memory cell 10 can be read in a reverse voltage sensing mode, in which bit line 20 is biased at a bias voltage and a bias current (to ground) is applied on source line 14. In this mode, memory cell 10 output voltage is on the source line 14 instead of on the bit line 20.

In the prior art, various combinations of positive or zero voltages are applied to word line 22, coupling gate 26, and floating gate 24 to perform read, program, and erase operations.

In response to the read, erase or program command, a logic circuit 270 (not shown) causes the various voltages to be supplied in a timely and least disturb manner to the various portions of both a selected memory cell 10 and any unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE NO. 1

Operation of Memory Cell 10 Using Positive Voltages for Read, Erase, and Program

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | 0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | 0 V | 1 uA | Vinh | 10-11 V | 0-2.6 V | 0-2.6 V | 4.5-5 V | 0-2.6 V | 4.5-5 V | 0-1 V/FLT |

In U.S. Pat. No. 9,361,995, issued on Jun. 7, 2016, which is incorporated by reference, negative voltages could be applied to word line 22 and/or coupling gate 26 during read, program, and/or erase operations. In this example, the voltage and current applied to the selected and unselected memory cell 10, are as follows.

TABLE NO. 2

| Operation of Memory Cell 10 Using Negative Voltages for Read and/or Program | | | | | | | | | | | |
|---|---|---|---|---|---|---|---|---|---|---|---|
| | WL | WL-unsel | BL | BL-unsel | CG | CG-unsel same sector | CG-unsel | EG | EG-unsel | SL | SL-unsel |
| Read | 1.0-2 V | −0.5 V/0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | −0.5 V/0 V | 1 uA | Vinh | 10-11 V | 0-2.6 V | 0-2.6 V | 4.5-5 V | 0-2.6 V | 4.5-5 V | 0-1 V/FLT |

In another example of the above-mentioned patent, negative voltages can be applied to word line 22 when memory cell 10 is unselected during read, erase, and program operations, and negative voltages can be applied to coupling gate 26 during an erase operation, such that the following voltages are applied:

TABLE NO. 3

| Operation of Memory Cell 10 Using Negative Voltages for Erase | | | | | | | | | | | |
|---|---|---|---|---|---|---|---|---|---|---|---|
| | WL | WL-unsel | BL | BL-unsel | CG | CG-unsel same sector | CG-unsel | EG | EG-unsel | SL | SL-unsel |
| Read | 1.0-2 V | −0.5 V/0 V | 0.6-2 V | 0-FLT | 0-2.6 V | 0-2.6 V | 0-2.6 V | 0-2.6 V | 0-2.6 V | 0 V | 0-FLT |
| Erase | 0 V | −0.5 V/0 V | 0 V | 0-FLT | −(5-9) V | 0-2.6 V | 0-2.6 V | 8-9 V | 0-2.6 V | 0 V | 0 V |
| Program | 1 V | −0.5 V/0 V | 1 uA | Vinh | 8-9 V | CGINH (4-6 V) | 0-2.6 V | 8-9 V | 0-2.6 V | 4.5-5 V | 0-1 V/FLT |

The CGINH signal listed above is an inhibit signal that is applied to the coupling gate 26 of an unselected cell that shares an erase gate 28 with a selected cell.

FIG. 2 depicts an example of another prior art non-volatile split gate memory cell 210. As with memory cell 10, memory cell 210 comprises substrate 12, first region (source line) 14, second region 16, channel region 18, bit line 20, word line 22, floating gate 24, and erase gate 28. Unlike memory cell 10, memory cell 210 does not contain a coupling gate and only contains four terminals—bit line 20, word line 22, erase gate 28, and source line 14. This significantly reduces the complexity of the circuitry, such as decoder circuitry, required to operate an array of such memory cells.

The erase operation (erasing through erase gate) and read operation are similar to that of the FIG. 1 except there is no control gate bias. The programming operation also is done without the control gate bias, hence the program voltage on the source line is higher to compensate for lack of control gate bias.

Table No. 4 depicts typical voltage ranges that can be applied to the four terminals for performing read, erase, and program operations:

TABLE NO. 4

| Operation of Memory Cell 210 | | | | | | | | |
|---|---|---|---|---|---|---|---|---|
| | WL | WL-unsel | BL | BL-unsel | EG | EG-unsel | SL | SL-unsel |
| Read | 0.7-2.2 V | −0.5 V/0 V | 0.6-2 V | 0 V/FLT | 0-2.6 V | 0-2.6 V | 0 V | 0 V/FLT/VB |
| Erase | −0.5 V/0 V | −.5 V/0 V | 0 V | 0 V | 11.5 V | 0-2.6 V | 0 V | 0 V |
| Program | 1-1.5 V | −.5 V/0 V | 1-3 μA | Vinh (~1.8 V) | 4.5 V | 0-2.6 V | 7-9 V | 0-1 V/FLT |

FIG. 3 depicts an example of another prior art non-volatile split gate memory cell 310. As with memory cell 10, memory cell 310 comprises substrate 12, first region (source line) 14, second region 16, channel region 18, bit line 20, and floating gate 24, and erase gate 28. Unlike memory cell 10, memory cell 310 does not contain a coupling gate or an erase gate. In addition, word line 322 replaces word line 22 and has a different physical shape than word line 22, as depicted.

One exemplary operation for erase and program of prior art non-volatile memory cell 310 is as follows. The cell 310 is erased, through a Fowler-Nordheim tunneling mechanism, by applying a high voltage on the word line 322 and zero volts to the bit line and source line. Electrons tunnel from the floating gate 24 into the word line 322 causing the floating gate 24 to be positively charged, turning on the cell 310 in a read condition. The resulting cell erased state is known as ‘1’ state. The cell 310 is programmed, through a source side hot electron programming mechanism, by applying a high voltage on the source line 14, a small voltage on the word line 322, and a programming current on the bit line 320. A portion of electrons flowing across the gap between the word line 322 and the floating gate 24 acquire enough energy to inject into the floating gate 24 causing the floating gate 24 to be negatively charged, turning off the cell 310 in read condition. The resulting cell programmed state is known as ‘0’ state.

Exemplary voltages that can be used for the read, program, erase, and standby operations in memory cell 310 are shown below in Table 5:

TABLE NO. 5

| Operation of Memory Cell 310 | | | |
|---|---|---|---|
| Operation | WL | BL | SL |
| Read | Vwlrd | Vblrd | 0 V |
| Program | Vwlp | Iprog/Vinh (unsel) | Vslp |
| Erase | Vwler | 0 V | 0 V |
| Standby | 0 V | 0 V | 0 V |

Vwlrd ~2-3 V
Vblrd ~0.8-2 V
Vwlp ~1-2 V
Vwler ~11-13 V
Vslp ~9-10 V
Iprog ~1-3 ua
Vinh ~2 V Also known in the prior art are various techniques for performing address fault detection in a memory system. Address faults sometimes occur due to imperfections in materials or due to radiation, such as solar flares, which can cause a “1” bit to flip to a “0” bit and vice-versa within an address. The result of an address fault is that a decoder might receive an intended address for an operation, but due to a fault occurring, a bit in the decoder will be altered, and the decoder might activate the word line corresponding to a different address, which will cause the wrong row in a memory array to be accessed. Another possible result is that the fault will result in the decoder activating the word line corresponding to the intended address and in addition a word line corresponding to another address different than the intended address. If not detected or corrected, an address fault will cause an erroneous read or write/program operation to occur.

FIG. 4 depicts prior art memory system 400. Prior art memory system 400 comprises row decoder 410 and array 420. Row decoder 410 receives address X, which here is an address or portion of an address corresponding to a selected row in array 420. Row decoder 410 decodes address X and selects a word line corresponding to that selected row. In this simplified example, four words lines are shown—WL0 (corresponding to address 0000), WL1 (corresponding to address 0001), WL2 (corresponding to address 0010), and WL3 (corresponding to address 0011). The selected word line will activate a row of memory cells within array 420. Thus, for example, if address 0010 is received, row decoder 410 will activate WL2 (corresponding to address 0010).

FIG. 5 depicts prior art memory system 400 as in FIG. 4. However, in this situation, an address fault has occurred. Row decoder 410 receives address 0010, but this time, instead of activating WL2 (corresponding to address 0010), row decoder 410 instead activates WL3 (corresponding to address 0011) due to a fault that occurred in row decoder 410. If this fault is undetected or uncorrected, an erroneous read or program operation occurs.

FIG. 6 depicts prior art memory system 400 as in FIGS. 4 and 5. However, in this situation, a different type of address fault has occurred than in FIG. 4. Row decoder 410 receives address 0010, but this time, instead of activating only WL2 (corresponding to address 0010), row decoder 410 instead activates both WL2 and WL3 (corresponding to addresses 0010 and 0011, respectively) due to a fault that occurred in row decoder 410. If this fault is undetected or uncorrected, an erroneous read or program operation will occur.

FIG. 7 depicts prior art memory system 700. Memory system 700 comprises row decoder 410 and array 420 as in the memory systems of previous figures. However, the word lines, such as WL0, WL1, WL2, and WL3, also are coupled to ROM (read-only memory) 710. ROM 710 performs a validation function. Each word line is coupled to a row of cells in ROM 710. When a particular word line is activated, the corresponding row of cells in ROM 710 is activated. By design, each word line corresponds to one row in ROM 710, and each row in ROM 710 stores a different value in its cells. In this example, each row in ROM 710 stores a value that is identical to the address corresponding to the word line tied to that row. Thus, WL0 corresponds to address 0000, and the value stored in the row in ROM 710 attached to WL0 also is 0000.

In FIG. 8, memory system 700 is again depicted. Row decoder 410 receives address 0010, but due to a fault condition, word line WL3 (corresponding to address 0011) is selected instead of word line WL2 (corresponding to address 0010). This will cause the wrong row of memory cells to be selected in array 420. Because word line WL3 is activated, the row in ROM 710 corresponding to word line WL3 also is activated, and ROM 710 outputs value 0011 stored in that row. Comparator 450 compares the address received by row decoder 410 (i.e., 0010) with the output of ROM 710 (i.e., 0011) and determines the values do not match. Comparator 450 can then output a value (such as “0”) that is understood to mean that a match was not found, which will indicate that an address fault has occurred.

Although prior art memory system 700 is able to detect address faults where the wrong word line is activated, prior art memory system 700 is unable to detect a fault in at least some situations where multiple rows are selected instead of just one row. In FIG. 9, memory system 700 again is depicted. In this example, an address fault occurs where the word line for the intended row (i.e., word line WL3 for address 0011) is activated and another word line (i.e., word line WL2 for address 0010) is activated. Word lines WL2 and WL3 will both be activated, and the contents for both rows in ROM 710 will be output. Logically, ROM 710 is designed such that when two rows are activated, the output will be an “OR” of the two rows. Thus, the stored values of 0010 and 0011 will cause the output to be 0011. Comparator 450 will compare the address received by row decoder 410 (i.e., 0011) and the output of ROM 710 (i.e., 0011). In this instance, a fault will not be detected. Thus, it can be appreciated that memory system 700 is not always effective at identifying address faults of this type where two rows are selected instead of one row.

What is needed is an improved address fault detection system that can identify three types of address faults in a memory system, namely, a first situation where the wrong word line is asserted, a second situation where the right word line is asserted but a second line also is erroneously asserted, and a third situation where no word line is asserted.

SUMMARY OF THE INVENTION

Various examples of memory systems comprising an address fault detection system are disclosed. The memory system comprises a first memory array, a row decoder, and an address fault detection system comprising a second array, wherein the row decoder decodes row addresses into word lines, each word line coupled to a row of cells in the first array and a row of cells in the second array. The second array contains digital bits and/or analog values that are used to identify address faults.

BRIEF DESCRIPTION OF THE DRAWINGS

FIG. 12 depicts a prior art encoding scheme for validation data for addresses.

FIG. 13A depicts an example of an encoding scheme for validation data for addresses.

FIG. 13B depicts another example of an encoding scheme for validation data for addresses.

FIG. 14 depicts another example of an encoding scheme for validation data for addresses.

FIG. 18 depicts another example of an encoding scheme for validation data for addresses.

FIG. 23 depicts an encoding scheme for an address fault detection system.

FIG. 24A depicts an encoding scheme for an address fault detection system.

FIG. 24B depicts an encoding scheme for an address fault detection system.

FIG. 25A depicts an encoding scheme for an address fault detection system.

FIG. 25B depicts an encoding scheme for an address fault detection system.

DETAILED DESCRIPTION

Figure 10:
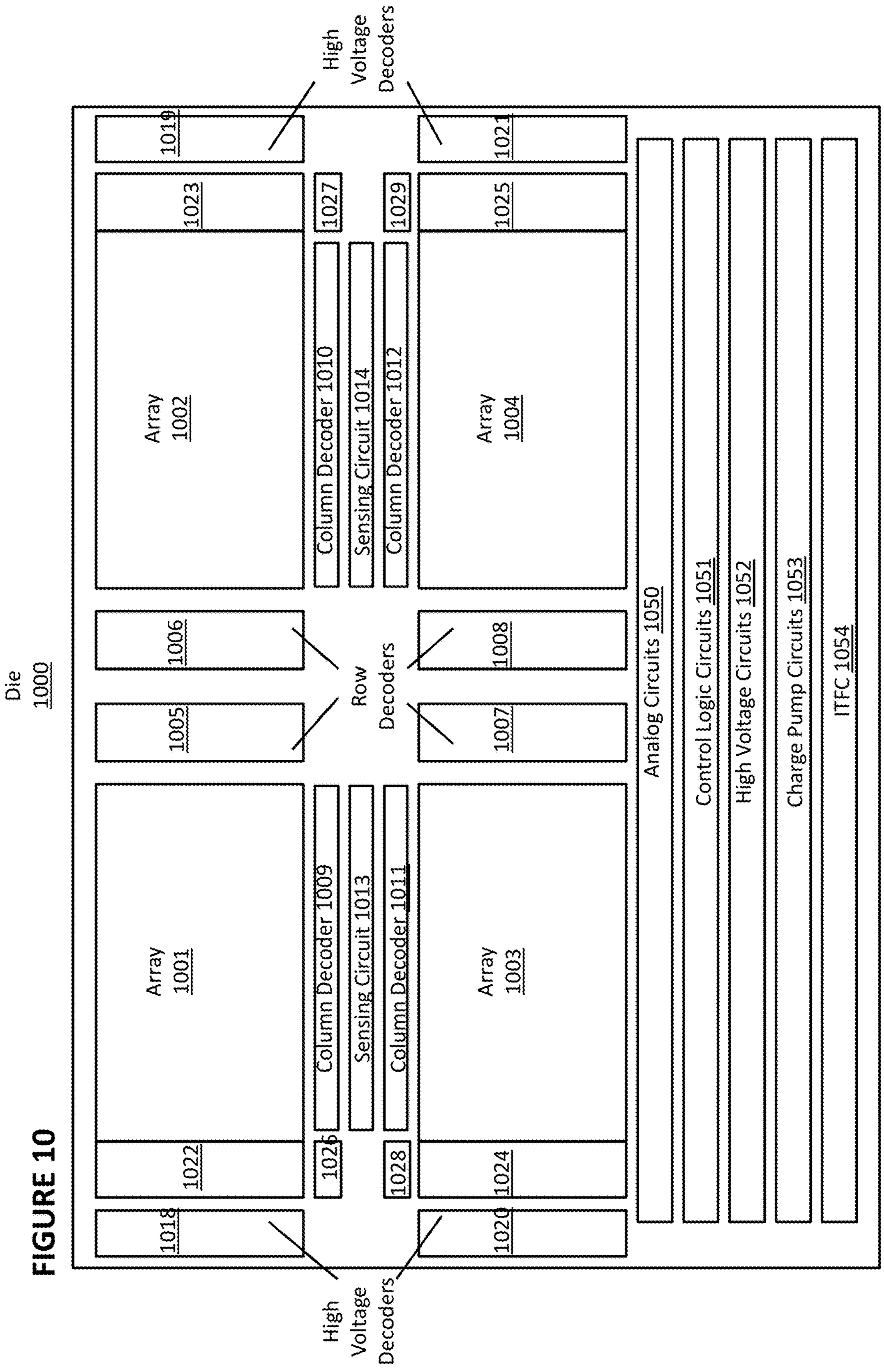
FIG. 10 is a layout diagram of a die comprising non-volatile memory cells of the type shown in FIGS. 1-3 and containing an improved address fault detection system.

FIG. 10 depicts an example of a memory system on a die. Die 1000 comprises: memory arrays 1001, 1002, 1003, and 1004 for storing data, each memory array optionally utilizing memory cell 10 as in FIG. 1, memory cell 210 as in FIG. 2, memory cell 310 as in FIG. 3, or other known types of memory cells; row decoder circuits 1005, 1006, 1007, and 1008 used to access the row in memory arrays 1001, 1002, 1003, and 1004, respectively, to be read from or written to; column decoder circuits 1009, 1010, 1011, and 1012 used to access the column in memory arrays 1001, 1002, 1003, and 1004, respectively, to be read from or written to; sensing circuit 1013 used to read data from memory arrays 1001 and 1003 and sensing circuit 1014 used to read data from memory arrays 1002 and 1004; analog circuits 1050; control logic circuits 1051 for providing various control functions, such as redundancy and built-in self-testing; high voltage circuits 1052 used to provide positive and negative high voltage supplies for the memory system; charge pump circuits 1053 to provide increased voltages for erase and program operations for memory arrays 1001, 1002, 1003, and 1004; interface circuit (ITFC) 1054 to provide interface pins to connect to other macros on chip; high voltage decoder circuits 1018, 1019, 1020, and 1021 for use during read, erase, and program operations as needed. Die 1000 further comprises address fault detection circuits 1022, 1023, 1024, and 1025 and array fault detection sense circuits 1026, 1027, 1028, and 1029, discussed in greater detail below with regard to certain embodiments.

Figure 11:
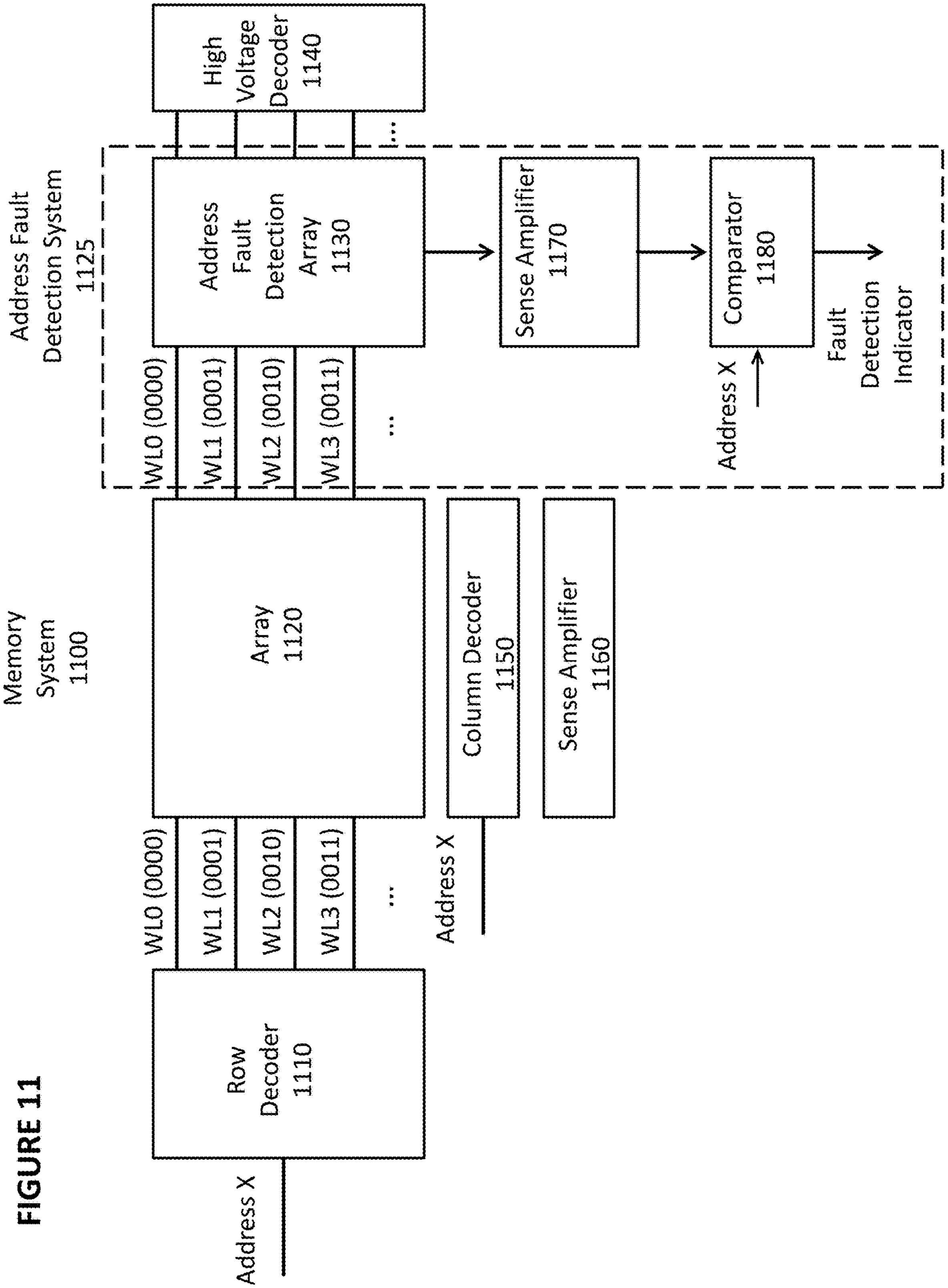
FIG. 11 depicts an example of an address fault detection system.

FIG. 11 depicts an example of a memory system with improved address fault detection capabilities. Memory system 1100 comprises row decoder 1110, array 1120, high voltage decoder 1140, column decoder 1150, and sense amplifier 1160, each of which corresponds to components with similar descriptions in FIG. 10. High voltage decoder 1140 provides high voltages needed for erase and program operations in array 1120.

Memory system 1100 further comprises address fault detection system 1125, which comprises address fault detection array 1130, sense amplifier 1170, and comparator 1180. Address fault detection array 1130 comprises a ROM array, flash array, or other non-volatile memory array that stores an encoded value for each possible address that can be received by row decoder 1110 and/or column decoder 1150.

Various encoding schemes are contemplated for generating validation data for each possible address. A prior art encoding scheme is shown in FIG. 12. In this example, a four-bit address is shown, which is the address that can be received by row decoder 1110 and/or column decoder 1150. For simplicity's sake, it is assumed that the row portion of the address is four bits, ranging from 0000 to 1111. Each of these possible addresses is associated with a word line, which here will range from WL0 to WL15 (16 different row addresses and word lines). Each word line will activate a row in address fault detection array 1130, and each row stores a value equal to the row address associated with that word line. Thus, address 0000 is associated with WL0, which in turn will activate a row storing the value 0000 in address fault detection array 1130.

Figure 9:
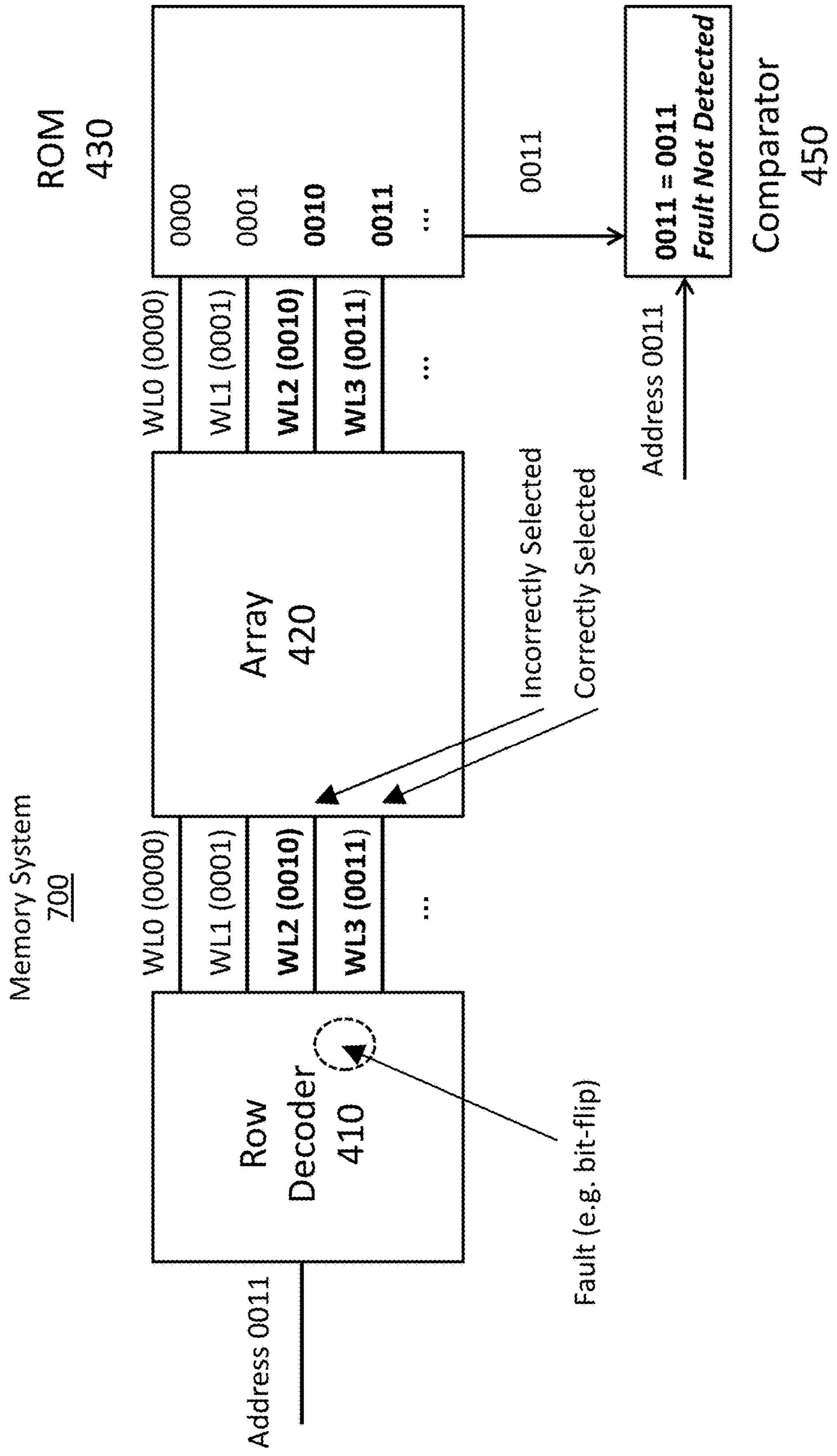
FIGURE 9 (PRIOR ART)
FIG. 9 depicts the prior art address fault detection system of FIG. 7 and another type of address fault.

With reference again to FIG. 11, under the encoding scheme of FIG. 12, Address X is received by row decoder 1110, which in turn will activate a word line that will access a row in array 1120 and a row in address fault detection array 1130. Sense amplifier 1170 will sense a value for each column in address fault detection array 1130 for which the word line has been activated. The value in each column will be a logical "OR" of the value in that column for each activated row in address fault detection array 1130, i.e. if multiple rows have been activated the value of the bits in the multiple activated rows for that column will be a 1, if any of the bits in that column of the activated multiple rows is a 1. The value from each column will be input to comparator 1180, which will compare the received values against address X (or, in this example, the row address portion of address X). As discussed previously, the output of comparator 1180 will identify a fault in situations where the wrong row has been activated, because in that situation the comparator will output a value indicating that the two input values are different. However, this scheme alone will not be effective in every situation involving a fault where two rows have been activated due to a fault, as described above in relation to FIG. 9.

An improved encoding scheme is shown in FIG. 13A to increase power savings. One of ordinary skill in the art will appreciate that storing and detecting a "1" value in address fault detection array 1130 consumes more energy than is the case for a "0" value. In this encoding scheme, an additional bit is stored, here labeled as "PB" (polarity bit). If PB is "0," then the encoded bits are a direct match to the associated address. If PB is "1," then the encoded bits are an inverted version of the associated address. In this example, a "1" value will be used for PB, and the bits will be stored inverted, whenever more than half of the bits in the address are a "1." For example, for an address "1111," a value of "0000" is stored in address fault detection array 1130, and a "1" is stored in the PB bit for that value to indicate that each the value is an inverted version of the corresponding address. By following this scheme, the memory system will consume less energy than would be the case in using the prior art scheme of FIG. 12 because overall fewer "1s" will be stored.

FIG. 13B shows another encoding scheme. It is similar to the encoding scheme of FIG. 13A but includes an additional column for multiple row detection (MRD) that is able to detect the situation where multiple rows are mistakenly activated, which is at the expense of additional power consumption compared to the encoding scheme of FIG. 13A. The MRD column contains a '1' in each row. A detailed description of the multiple row detection is contained below.

Another improved encoding scheme is shown in FIG. 14. Here, each "0" in the address is encoded as "01" in address fault detection array 1130, and each "1" in the address is encoded as "10" in address fault detection array 1130. Thus, the address "0000" is encoded as "01010101," and address "1111" is encoded as "10101010." Each bit Ax in the address is encoded as EAx and EBx. This means that the encoded values in address fault detection circuit 1130 will contain twice as many bits as the corresponding address. Because any two addresses will always differ from each other by at least one bit, the sum of any two encoded values corresponding to two addresses will contain a "11" pattern in at least one bit pair (EAx and EBx). Thus, detecting a "11" pattern in the sensed value of address fault detection array 1130 will indicate that two addresses have been activated, which is a fault condition. This is a type of fault condition that the prior art solution of FIG. 12 is unable to detect at least some of the time.

Figure 15:
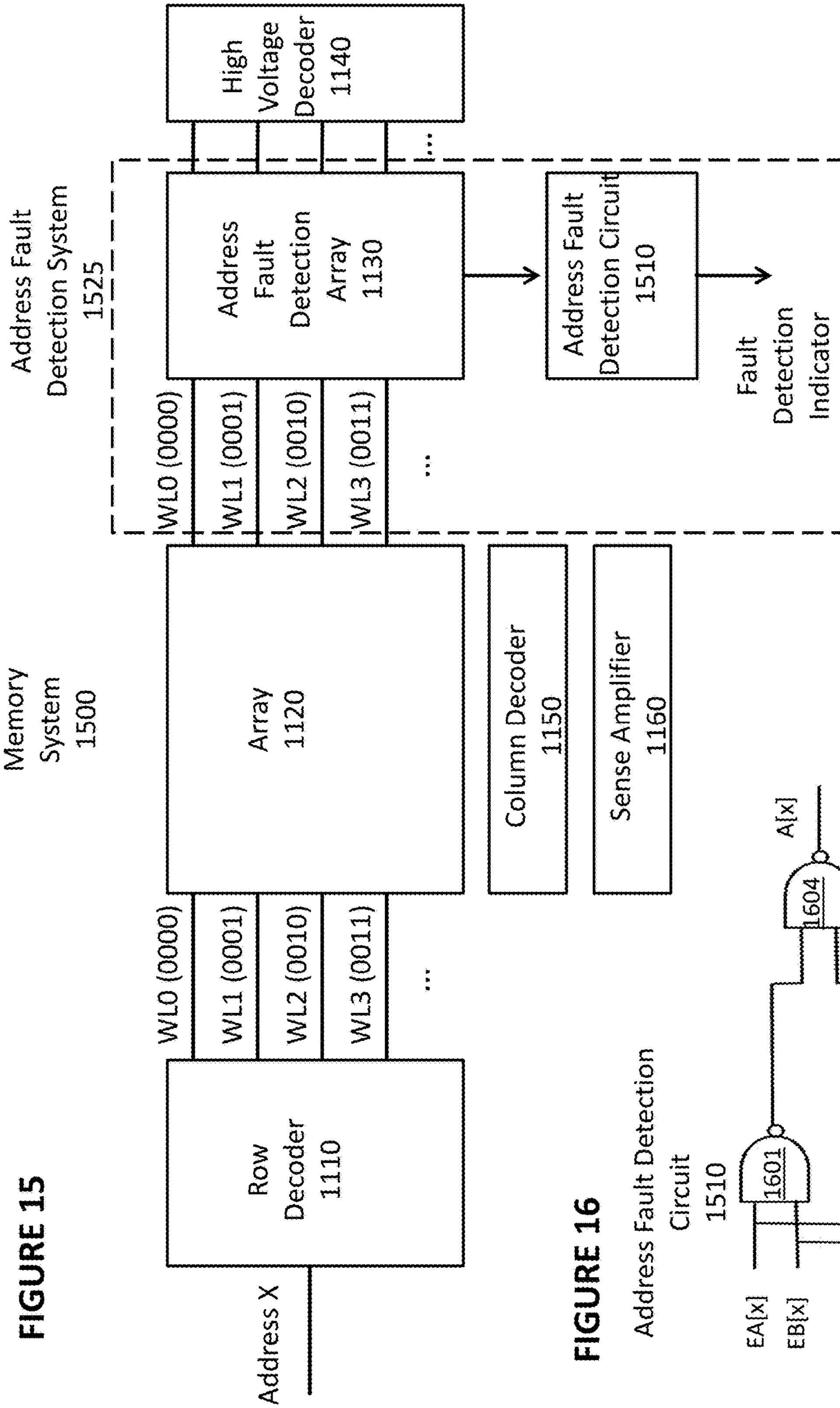
FIG. 15 depicts another example of an address fault detection system.

FIG. 15 depicts an example of a memory system with an improved address fault detection system for implementing the encoding scheme of FIG. 14. Memory system 1500 comprises the same components as memory system 1100, except that address fault detection system 1525 follows a different design than address fault detection system 1125. Here, address fault detection system 1525 comprises address fault detection array 1130 and address fault detection circuit 1510. Address fault detection circuit 1510 receives an output from each column in address fault detection array 1130 for which the word line has been activated, with the values in any given column for which the word line has been activated being logically "OR' d" to create the output for that column.

Figure 16:
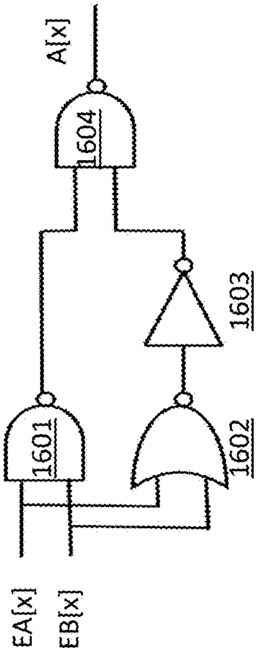
FIG. 16 depicts an example of an address fault detection circuit.

FIG. 16 further depicts an example of address fault detection circuit 1510. In response to the activation of a row containing bits EA[x] and EB[x] (where x=number of address bits encoded in each row of address fault detection circuit 1210), each pair of bits, EA[x] and EB[x], are input into address fault detection circuit 1510. Address fault detection circuit 1510 comprises a set of NAND gates 1601 and 1604, NOR gate 1602, and inverter 1603, configured as shown, for each pair of bits EA[x] and EB[x].

The output, A[x], of address fault detection circuit 1510 for a pair of bits EA[x] and EB[x] will be a "0" if the input is "01" or "10" (where the first bit is EA[x] and the second bit is EB[x]) and will be a "1" otherwise. A "1" indicates a fault condition (because a "11" or "00" pattern should not occur during normal operation based on the encoding scheme shown in FIG. 14, where EA[x] and EB[x] are always different bit values), and would indicate that two rows had been activated instead of one row, which is the only situation that will cause a EAx and EBx to be "11," that the received address has been altered, which is the only situation that will cause a EAx and EBx to be "00," or that no row has been selected. Thus, address fault detection system 1525 is able to detect a fault situation where two rows have been improperly activated or that no row has been selected.

Figure 17A:
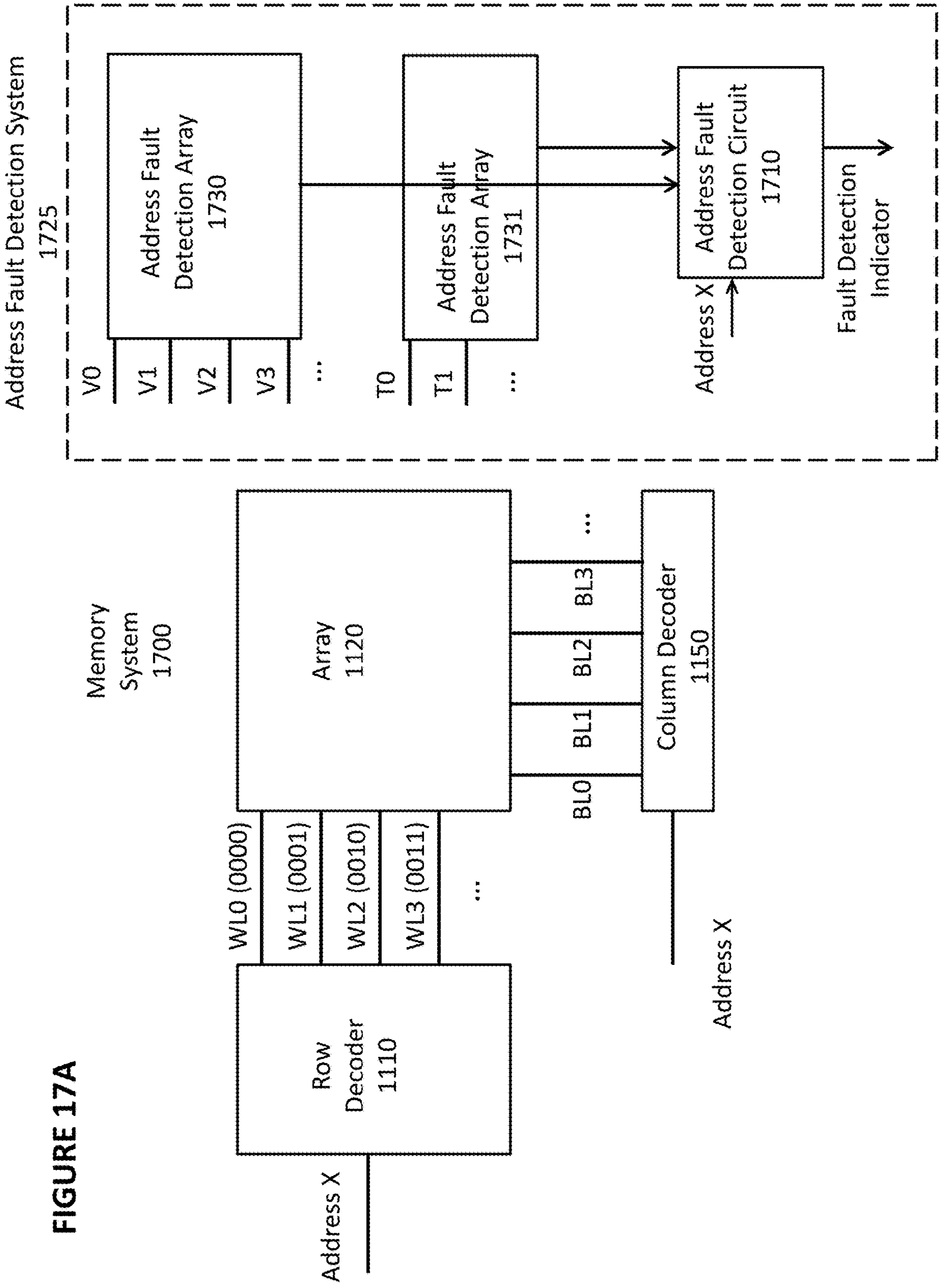
FIGS. 17A and 17B depict another example of an address fault detection system.

FIG. 17A depicts another example of a memory system with an improved address fault detection system. Memory system 1700 includes row decoder 1110, array 1120, and column decoder 1150 as in previously described examples. Memory system 1700 further includes address fault detection system 1725, which comprises address fault detection array 1730, address fault detection array 1731, and address fault detection circuit 1710.

Figure 17B:
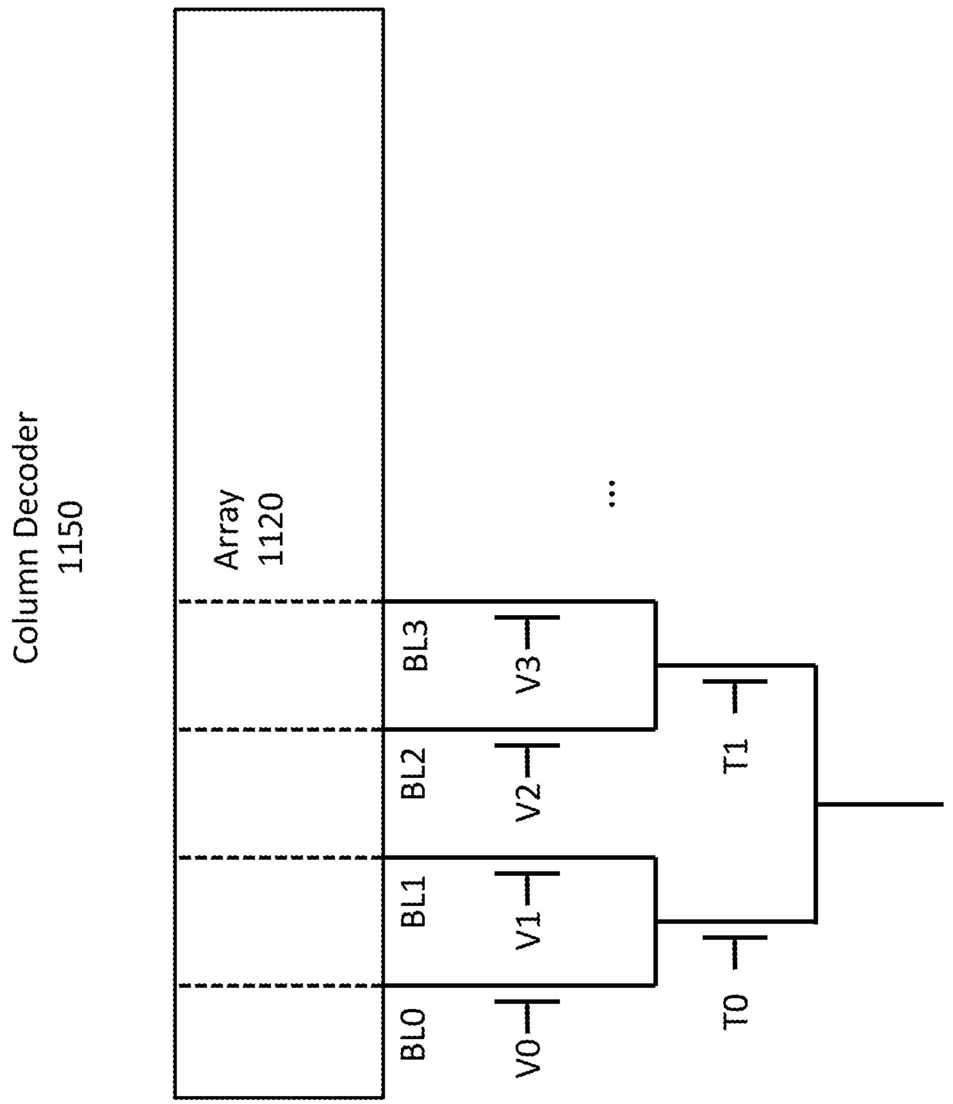

Column decoder 1150 is a set of multiplexors and may comprise tiered multiplexors. With reference to FIG. 17B, a portion of an example of column decoder 1150 is shown.

Each column in array 1120 is coupled to a bit line. Here, four bit lines are shown and labeled as BL0 to BL3. A first tier of multiplexors selects a pair of adjacent bit lines to be activated. A portion of two such first tier multiplexors are shown: T0 and T1. A second tier of multiplexors selects a bit line among a pair of adjacent bit lines. Here, each bit line has its own second tier multiplexor, which are partially shown and receive signals labeled as V0 through V3. Thus, if BL0 is intended to be selected, then T0 and V0 will be activated; if BL1 is intended to be selected, then T0 and V1 will be activated; if BL2 is intended to be selected, then T1 and V2 will be activated; and if BL3 is intended to be selected, then T1 and V3 will be activated.

With reference to both FIGS. 17A and 17B, it can be appreciated that column decoder 1150 is susceptible to faults as is row decoder 1110. In this example, address X is input to column decoder 1150. Here address X comprises a row address portion and a column address portion. The column portion of address X contains bits that indicate which multiplexors are to be activated (which in turn will assert a bit line). Each activation signal for the second tier multiplexors of column decoder 1150 (V0, V1, V2, V3, . . . ) is coupled to a row in address fault detection array 1730 and each activation signal for the first tier multiplexors of column decoder 1150 is coupled to a row in address fault detection array 1731 (T0, T1, . . . ). When a bit line is asserted, a row in address fault detection array 1730 will be asserted and a row in address fault detection array 1731 will be asserted, and a value will be output by each of address fault detection array 1730 and address fault detection array 1731. Those values can be compared by address fault detection circuit 1710 to the column portion of address X. If the values are different, then a fault has occurred and the wrong bit line has been asserted.

An example encoding scheme for use in the example of FIG. 17A is shown in FIG. 18. Here, two tiers of multiplexors are used. The first tier comprises multiplexors controlled by values T[0] through T[3], which have column address bits AY[4] and AY[0]. The second tier comprises multiplexors controlled by values V[0] through V[7], which have column address bits AY[2], AY[1], and AY[0]. It is to be understood that additional tiers are possible. Address fault detection array 1330 and 1331 contains an encoded value for each multiplexor value, specifically, AYA[2], AYB[2], AYA[1], AYB[1], AYA[0], and AYB[0] for V[0] . . . V[7] and AYA[4], AYB[4], AYA[3], and AYB[3] for T[0] . . . T[3]. As in FIG. 14, each "0" in the column component of the address is encoded as "01," and each "1" in the address is encoded as "10."

With reference again to FIG. 17A, the encoding scheme of FIG. 18 can be used. Address fault detection circuit 1710 follows the same design as address fault detection circuit 1510 and will output a "0" if a "11" or "00" pattern is detected in bit pairs of the encoded values stored in address fault detection array 1310 (because a "11" or "00" pattern should not occur during normal operation based on the encoding scheme shown in FIG. 18, where AYA[x] and AYB[x] are always different bit values). Thus, as a result of the operation of address fault detection system 1725, memory system 1700 is able to detect faults in the column components of addresses.

Figure 19:
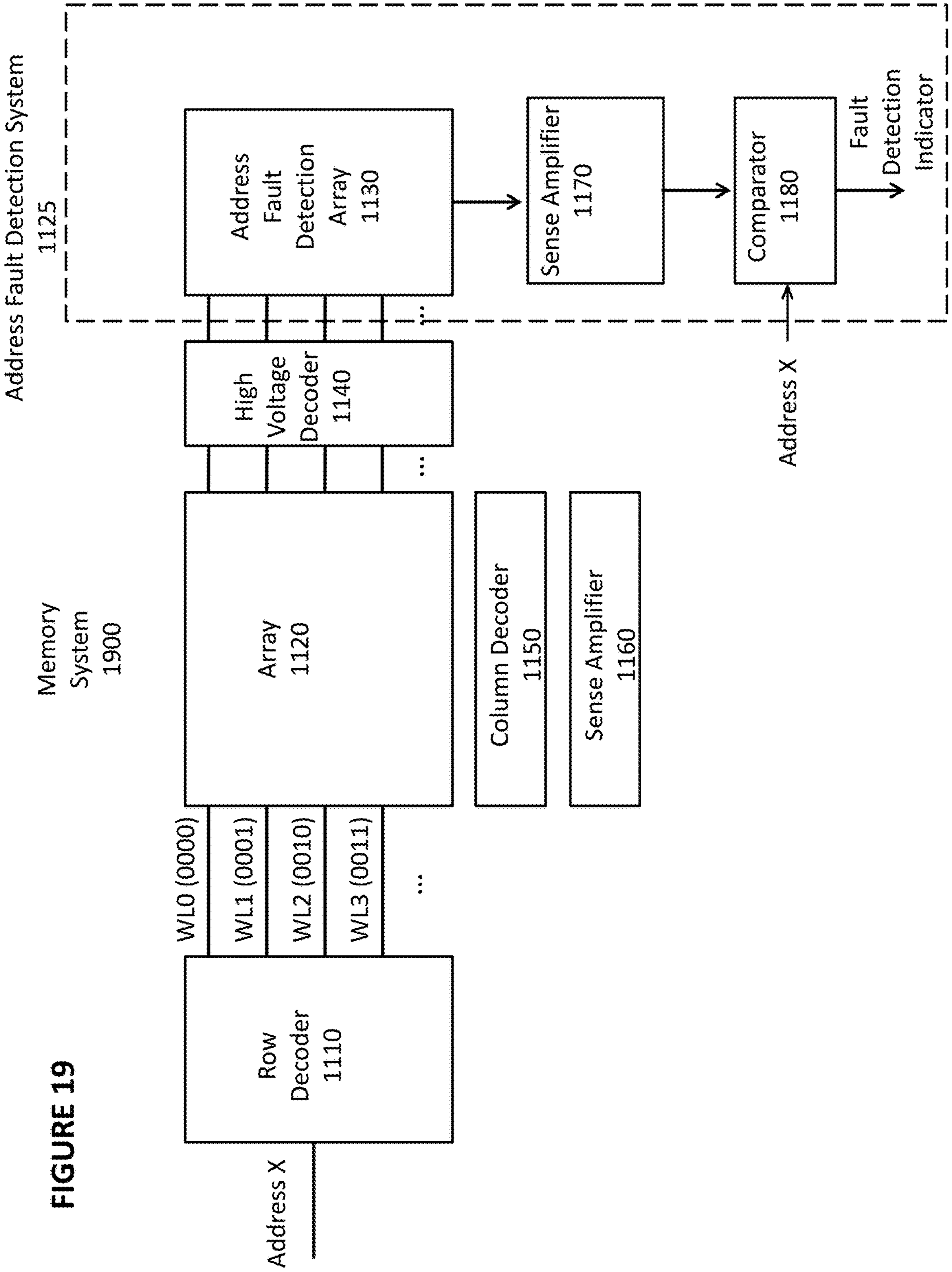
FIG. 19 depicts another example of an address fault detection system.
Figure 20:
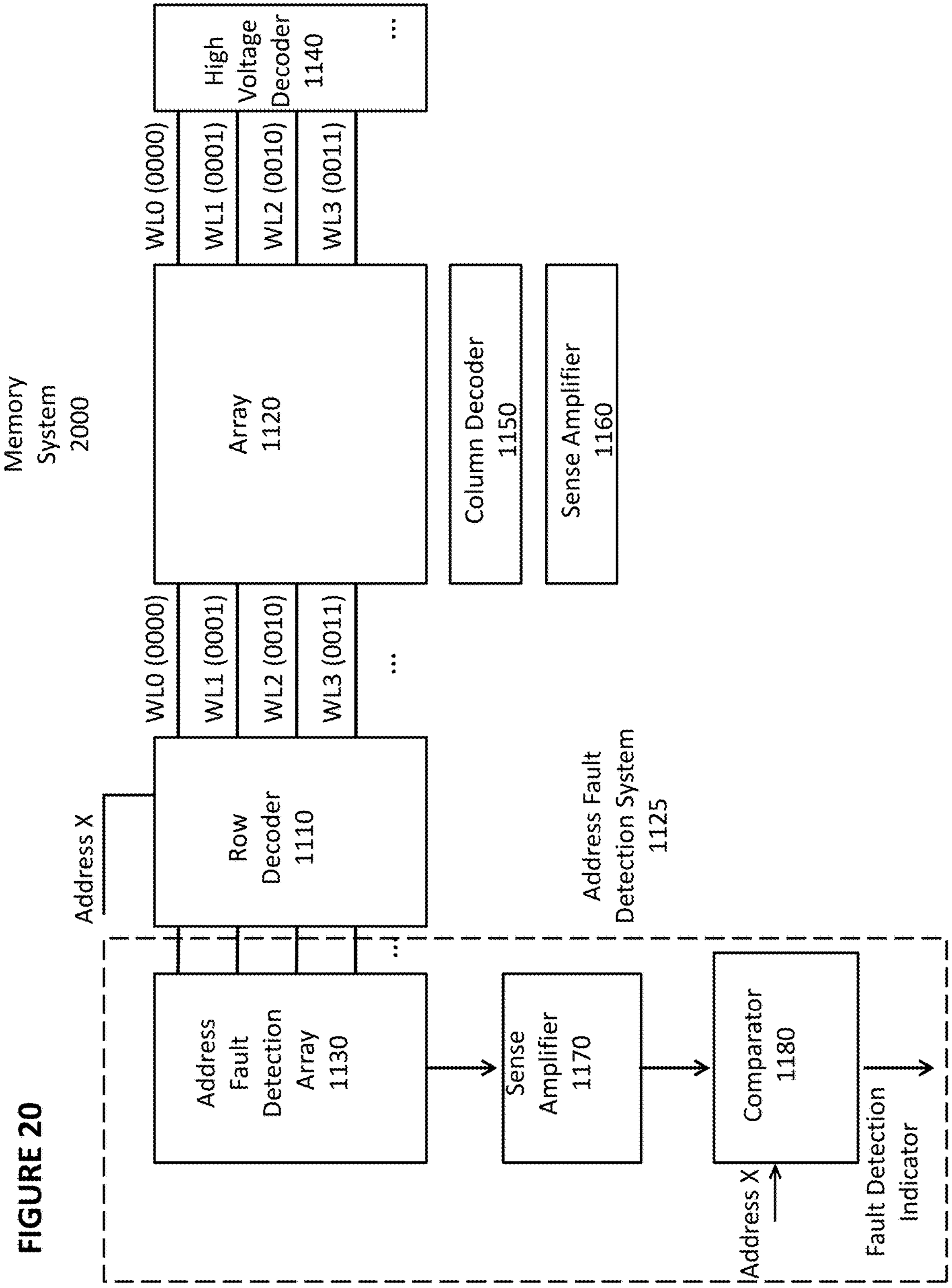
FIG. 20 depicts another example of an address fault detection system.

FIGS. 19 and 20 show variations of the examples already described. As can be seen, the functional blocks of the examples can be arranged in different configurations.

FIG. 19 depicts memory system 1900. Memory system 1900 is identical to memory system 1100 in FIG. 11 except that high voltage decoder 1140 is coupled between array 1120 and address fault detection array 1130 The system otherwise operates the same as in FIG. 11.

FIG. 20 depicts memory system 2000. Memory system 2000 is identical to memory system 1100 in FIG. 11 except that row decoder 1110 is coupled between array 1120 and address fault detection array 1130. The system otherwise operates the same as in previous examples.

Figure 21:
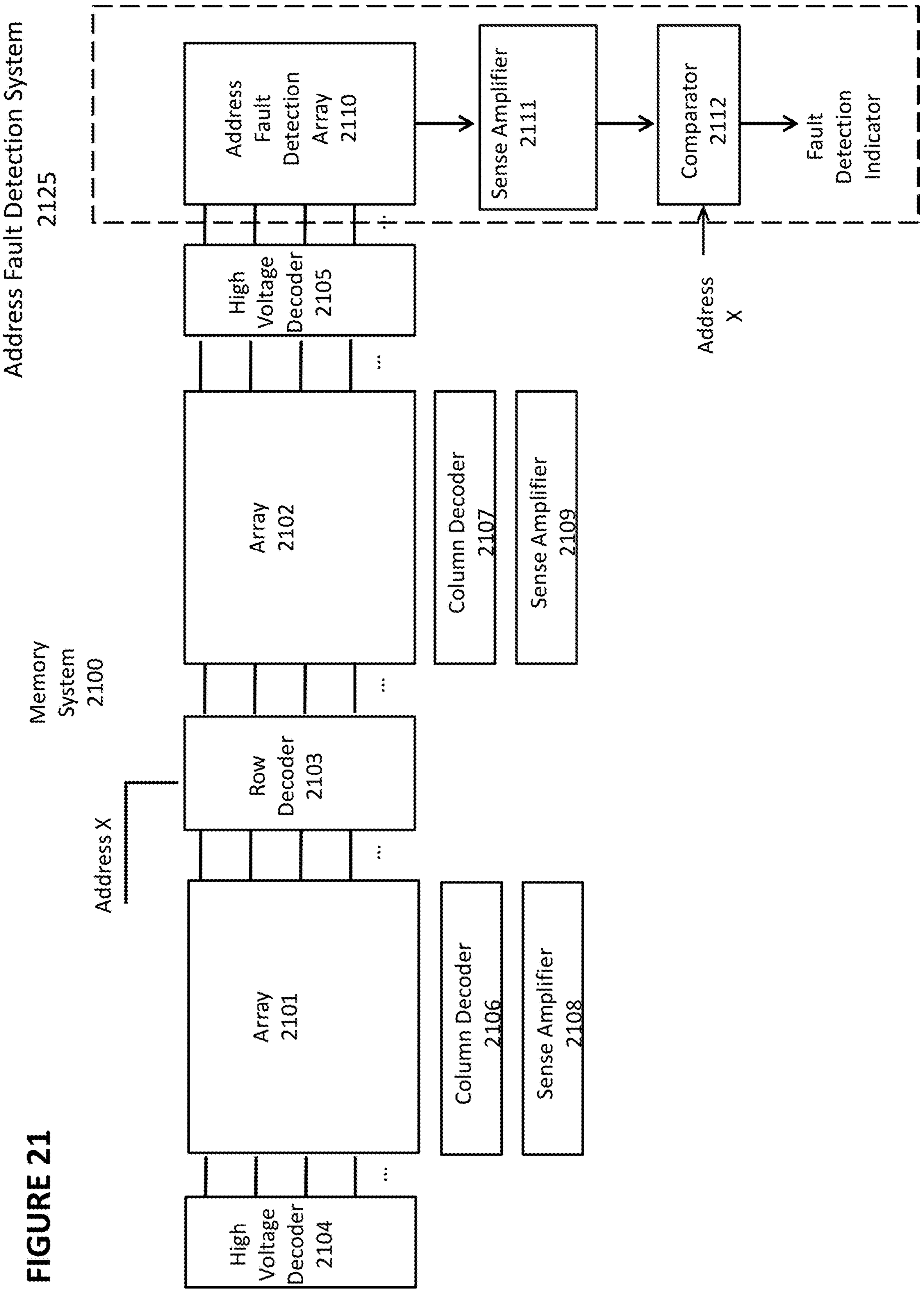
FIG. 21 depicts another example of an address fault detection system.

FIG. 21 depicts memory system 2100. Here row decoder 2103 operates with two arrays, array 2101 and array 2102. Array 2101 is coupled to high voltage decoder 2104, column decoder 2106, and sense amplifier 2108. Array 2102 is coupled to high voltage decoder 2105, column decoder 2107, and sense amplifier 2109. A single address fault detection system 2125 is used. Address fault detection system 2125 comprises address fault detection array 2110, sense amplifier 2111, and comparator 2112. Address fault detection array 2110 is coupled to sense amplifier 2111 and comparator 2112 and can operate as in previously-described examples.

Figure 22:
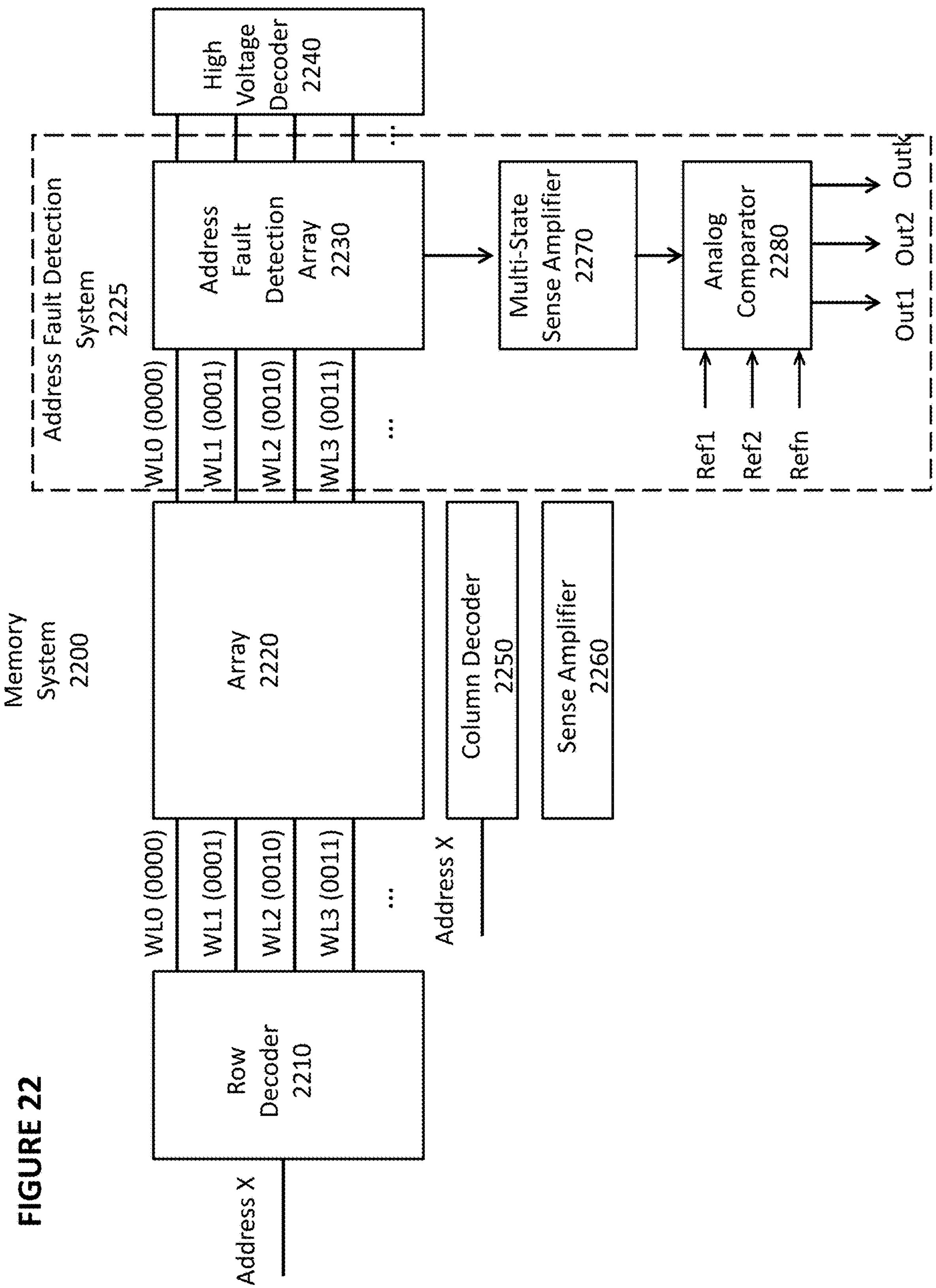
FIG. 22 depicts another example of an address fault detection system.

FIG. 22 depicts an example of a memory system with an improved address fault detection system. Memory system 2200 comprises row decoder 2210, array 2220, high voltage decoder 2240, column decoder 2250, and sense amplifier 2260, each of which corresponds to components with similar descriptions in FIGS. 10, 11, 15, 17A, 19, 20, and 21. Memory system 2200 further comprises address fault detection system 2225, which comprises address fault detection array 2230, analog multi-state sense amplifier 2270, and analog comparator 2280. Address fault detection array 2230 comprises a ROM array, flash array, or other non-volatile memory array that stores an encoded value for each possible address that can be received by row decoder 2210 and/or column decoder 2250.

Memory system 2200 utilizes the encoding scheme shown in FIG. 23. Address fault detection array 2230 contains an encoded value for each possible address that is identical to the associated address. In this example, a four-bit address is shown, [A3:A0], which is the address that can be received by row decoder 2210 and/or column decoder 2250. For simplicity's sake, it is assumed that the row portion of the address is four bits, ranging from 0000 to 1111. Each of these possible addresses is associated with a word line, which here will range from WL0 to WL15 (16 different row addresses and word lines). Each word line will activate a row in address fault detection array 2230, and each row in address fault detection array 2230 stores a value equal to the row address associated with that word line. Thus, address 0000 is associated with WL0, which in turn will activate a row storing the value 0000 in address fault detection array 2230 in bit locations [EA3:EA0].

In FIG. 22, multi-state sense amplifier 2270 is able to sense analog levels in each column corresponding to more than 2-bit (or more) values; for instance, it can sense 2-bit values in a column instead of a 1-bit value. The current generated in each column, representing the value for that column, is added for each activated row in address fault detection array 1130, i.e. if multiple rows have been activated the value of the bits in the multiple activated rows for that column are added together. Multi-state sense amplifier 2270 optionally comprises a multi-state digital sense amplifier, a multi-state analog sense amplifier, or both. In the example illustrated in FIG. 23, row 6 (ROM code pattern (0110) and row 7 (code pattern 0111) are unintentionally shorted together, causing an error. Multi-state sense amplifier 2270 will indicate the output pattern as (0,2,2,1), which essentially is the value of row 6 added to the value of row 7. The fault address can be determined by subtracting the input address bits from the output pattern, which here is: 0221−0110=0111.

FIGS. 24A, 24B, 25A, 25B show additional encoding schemes that can be implemented in address fault detection system 2225 of FIG. 22.

FIG. 24A shows an example for encoding a ROM pattern for a 5-bit input addresses A [4:0]. The cells in the table that are blank should be understood to contain a "0". The encoded word pattern is such that the number of '1's' on each code word is <half of the number of bits in the encoded word, as shown. For example, in encoded words ER [0:9] for all 32 rows, there are three, and only three, '1's' in any word. As shown for encoded word ER [0:9], the encoded pattern is such that there is one, and only one, '1' for the first four encoded bits ER[0:3], one and only one '1' for the second four encoded bits ER[4:7], and one and only one '1' for the last two encoded bits ER[8:9].

In another example shown in FIG. 24B, the encoded pattern is such that each word contains one, and only one, "1" within the first 8 encoded bits ER [0:7] and one, and only one, "1" in the next four bits ER [8-11]. The cells in the table that are blank should be understood to contain a "0". Thus, each of the 32 rows contains exactly two "l's."

More generally, for encoded words as in FIG. 24A or 24B, for K-bit and/or L-bit groups out of N-bit coded words, there is only one '1' in the K-bit group and/or the L-bit group, where K>2 and/or L>2. For example, for 12-bit coded words (N=12), there are 3 groups of 4 bits (K=4), where each 4-bit group contains one, and only one, '1'. In another example, different combinations of K-bit and/or L-bit groups like 8-bit groups (K=8) together with 4-bit (L=4) groups can be combined together.

Figure 1:
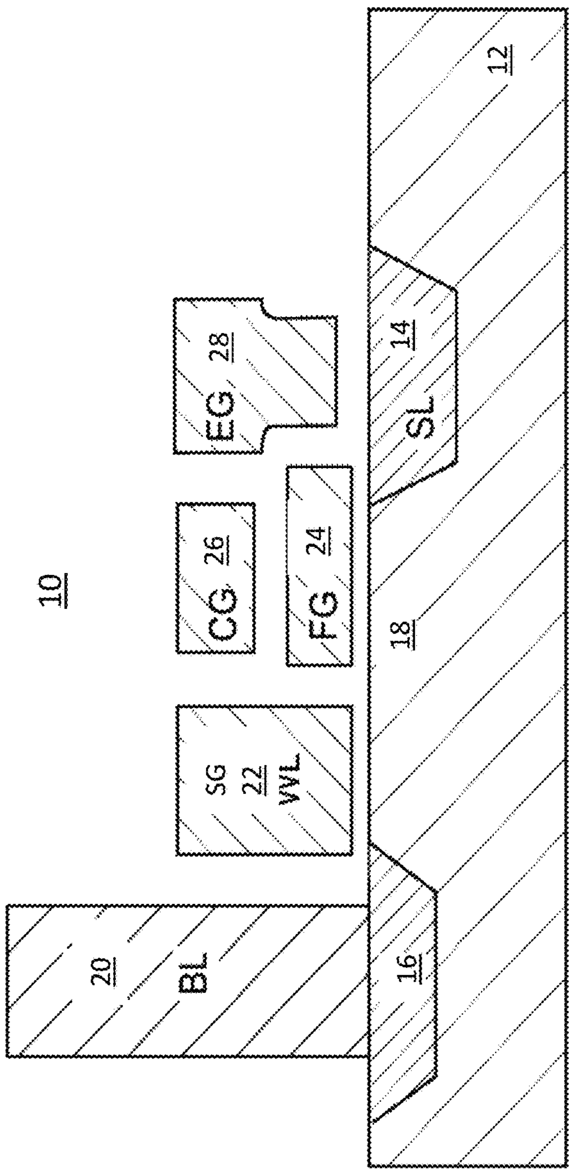
FIGURE 1 (PRIOR ART)
FIG. 1 is a cross-sectional view of a prior art non-volatile memory cell to which the invention can be applied.
Figure 2:
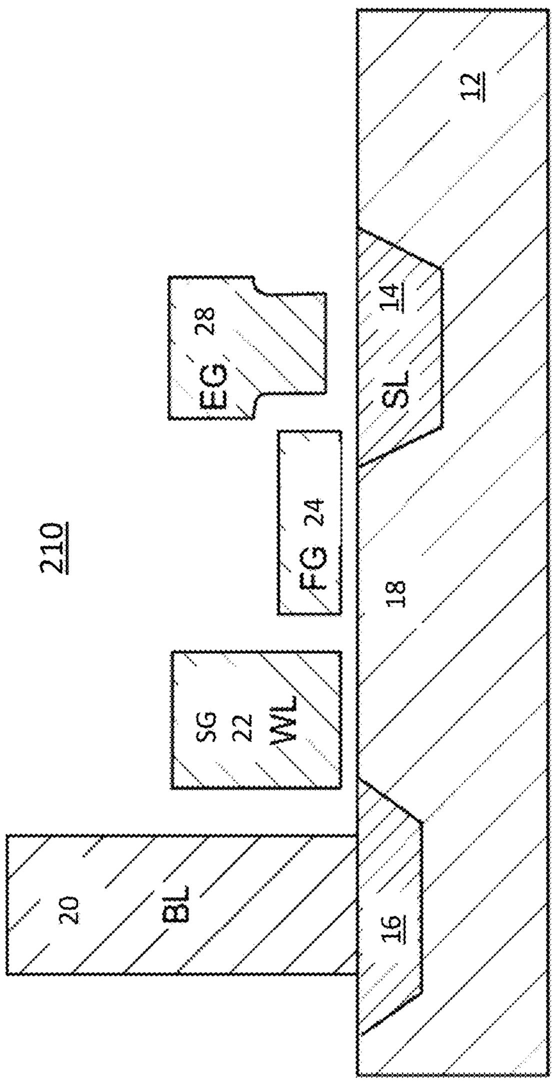
FIGURE 2 (PRIOR ART)
FIG. 2 is a cross-sectional view of another prior art non-volatile memory cell to which the invention can be applied.
Figure 3:
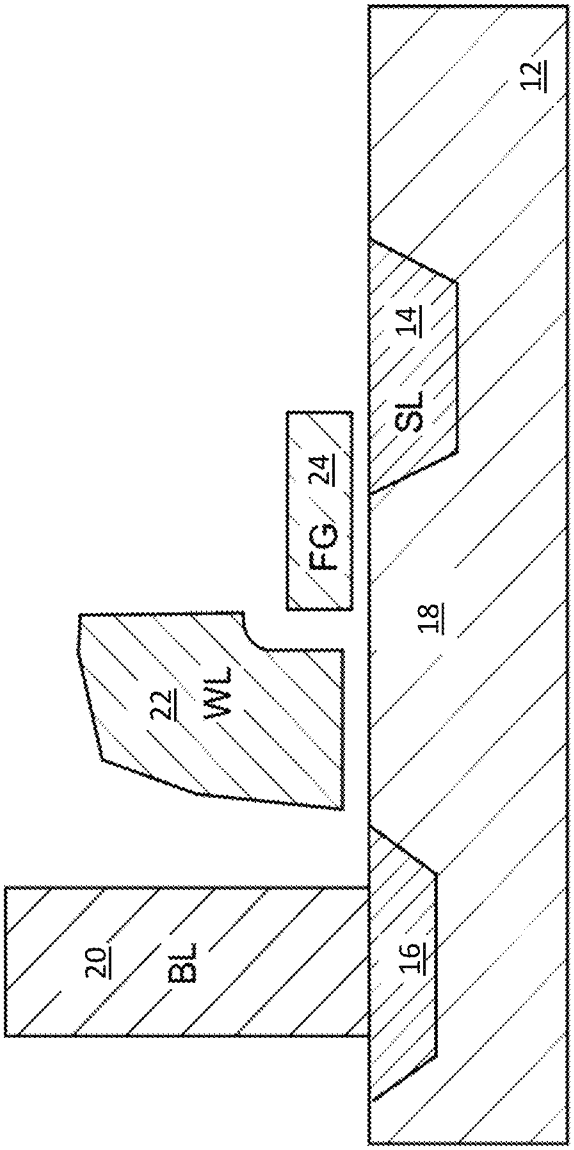
FIGURE 3 (PRIOR ART)
FIG. 3 is a cross-sectional view of another prior art non-volatile memory cell to which the invention can be applied.
Figure 4:
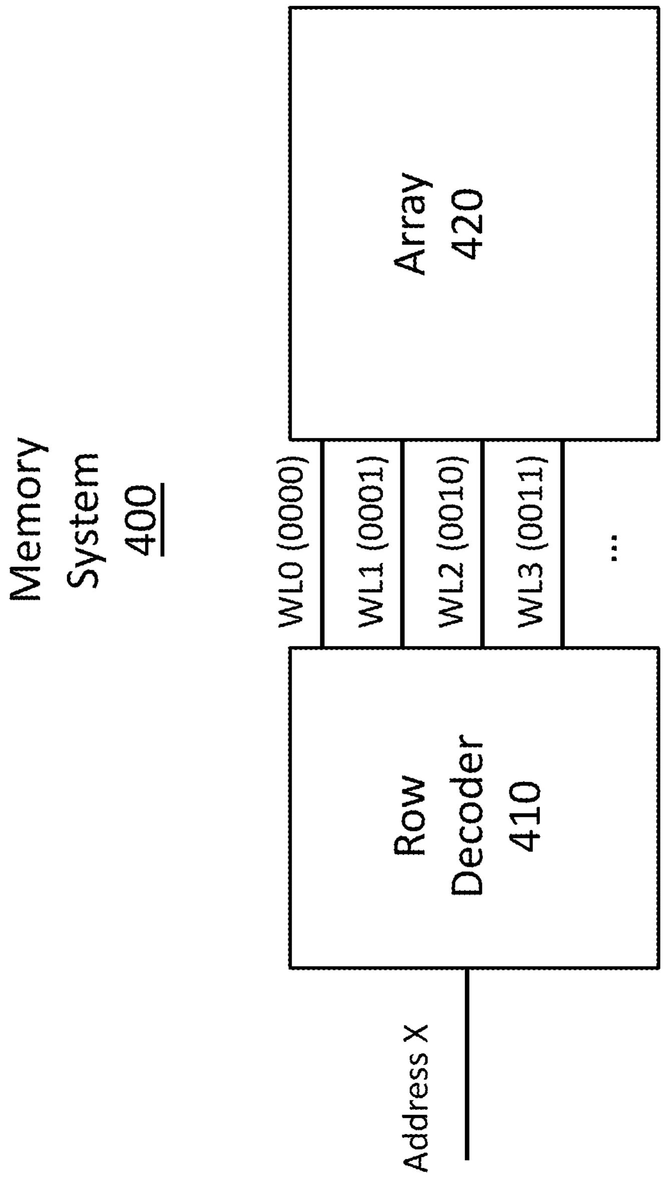
FIGURE 4 (PRIOR ART)
FIG. 4 depicts a prior art memory system.
Figure 5:
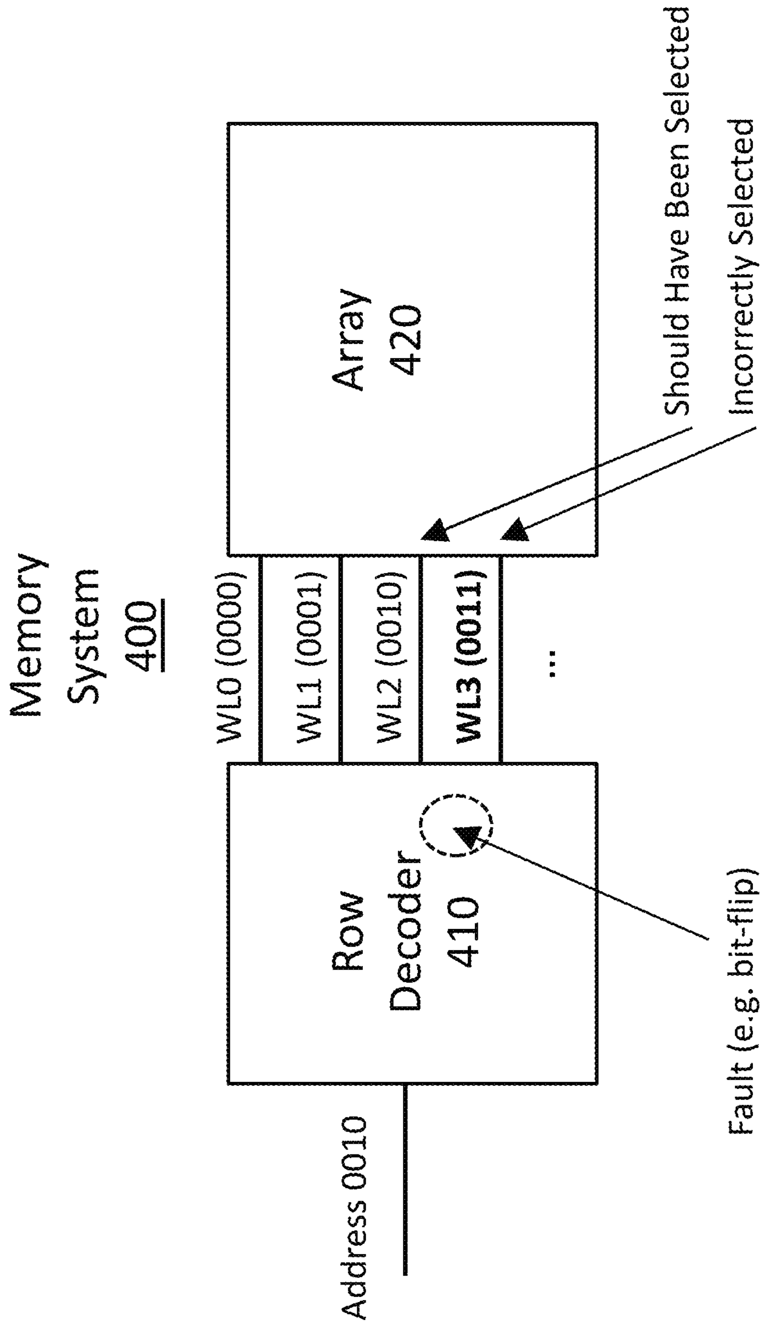
FIGURE 5 (PRIOR ART)
FIG. 5 depicts one type of address fault that can occur in the prior art memory system of FIG. 4.
Figure 6:
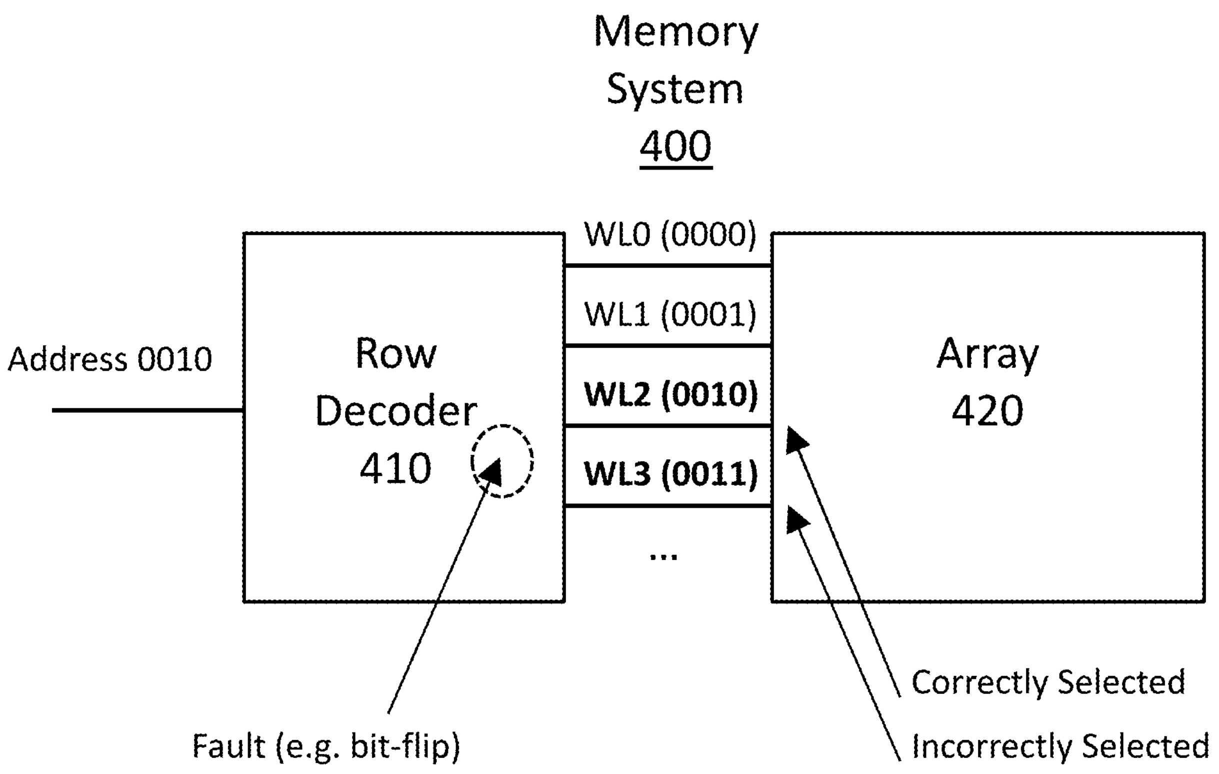
FIGURE 6 (PRIOR ART)
FIG. 6 depicts another type of address fault that can occur in the prior art memory system of FIG. 4.
Figure 7:
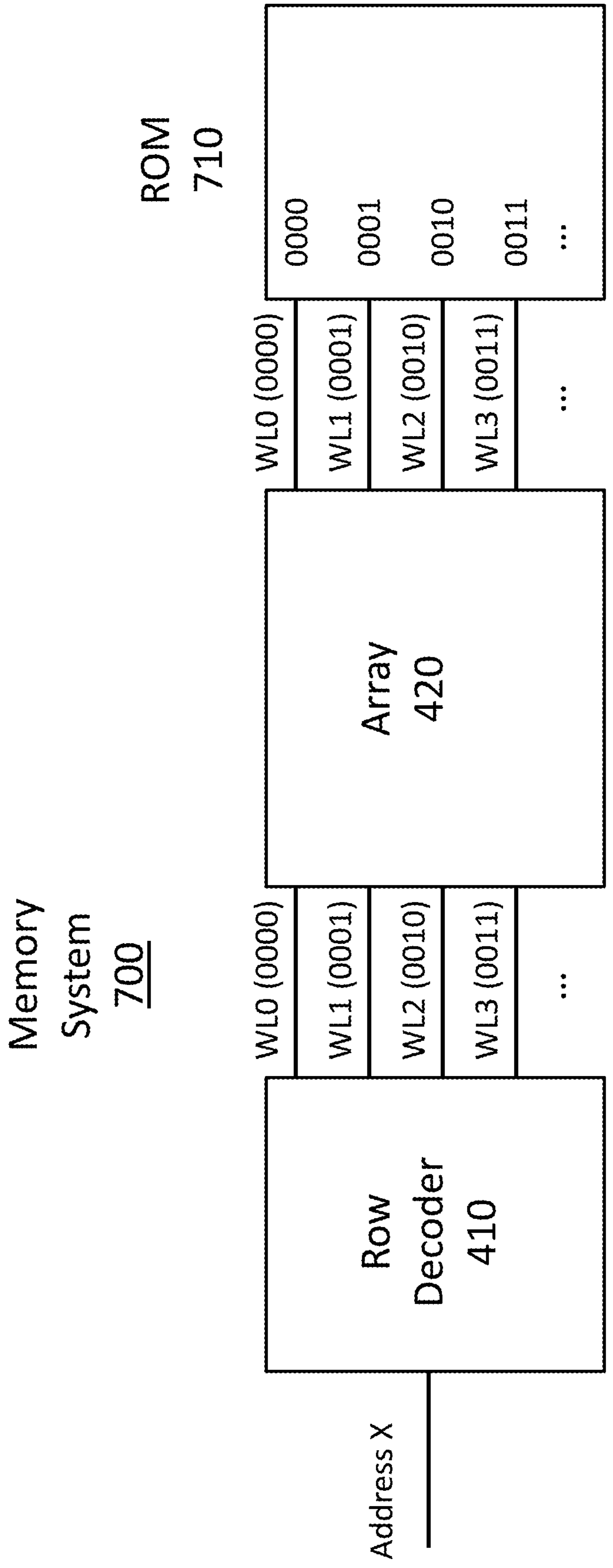
FIGURE 7 (PRIOR ART)
FIG. 7 depicts a prior art address fault detection system.
Figure 8:
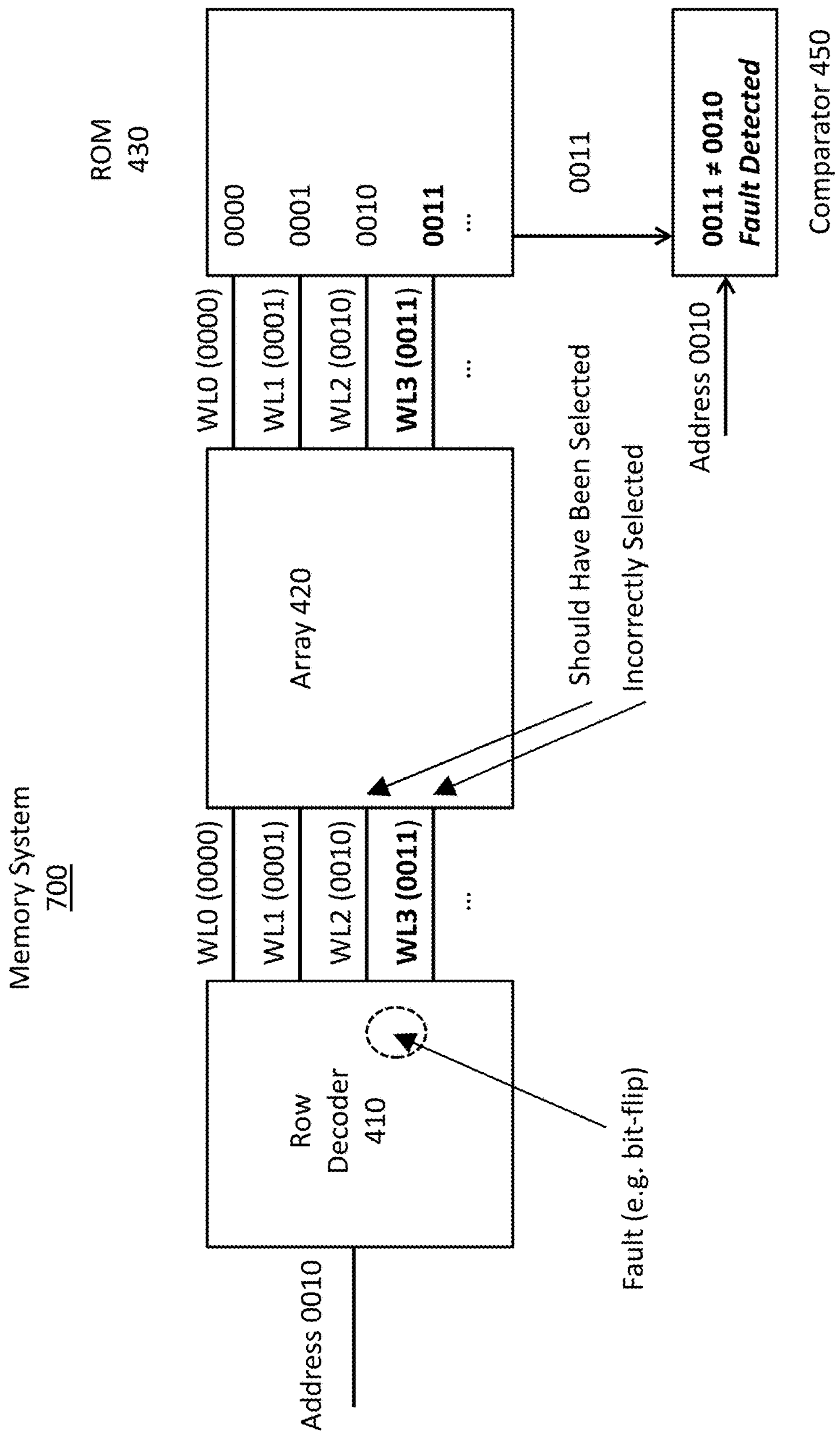
FIGURE 8 (PRIOR ART)
FIG. 8 depicts the prior art address fault detection system of FIG. 7 and one type of address fault.

FIG. 25A shows an encoded scheme using digital ROM cell and analog (multi state or multi-level) ROM cells (such as memory cells in FIG. 1 or 2 or 3). An encoded word in this example comprises four digital bits ER[0-3] and four analog bits EAR [0:3] (analog ROM cells, e,g, multi-state or multi-level cells, meaning storing multilevel per cell), corresponding to four digital columns ER[0:3] and four analog columns EAR [0:3]. Multi-state sense amplifier 2270 is used for the analog columns to detect whether the cell current is 0.5×Ir, or 1.0×Ir. The first 4-bits ER [0:3] follow the same pattern as in FIG. 24A. The cells in the table that are blank should be understood to contain a "0". The first four encoded words have EAR [0] equal to 0.5×Ir (ROM cell current), the next four encoded words have EAR [0] equal to 1.0×Ir (ROM cell current). This characteristic is used to differentiate the first four encoded words from the second four encoded words. Columns EAR[1], EAR[2], and EAR[3] perform the same function for subsequent groups of 8 rows.

FIG. 25B shows an encoded scheme using analog ROM cells only. An encoded word in this example comprises 6 analog ROM cells. Multi-state sense amplifier 2270 is used to read all columns.

Figure 26:
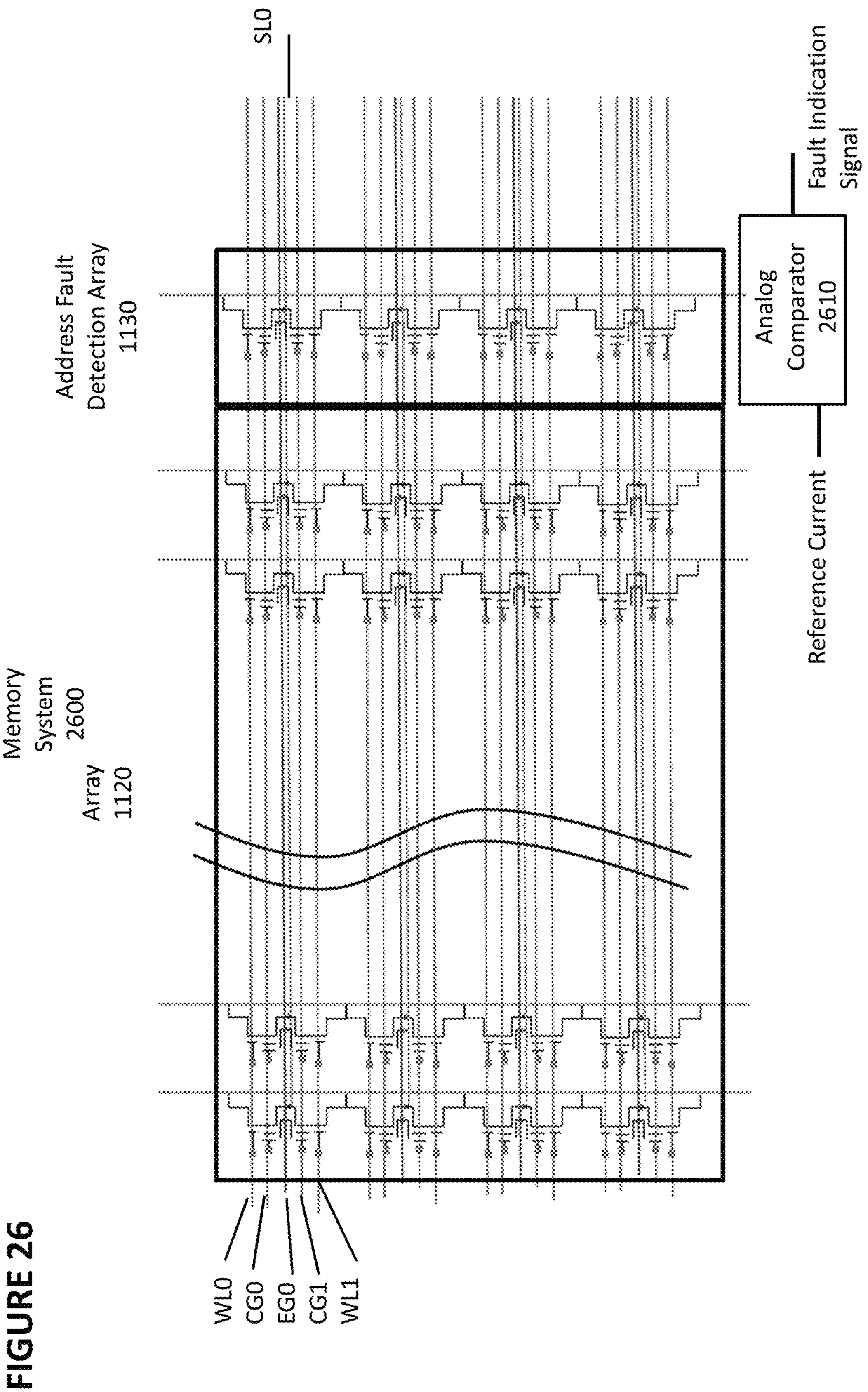
FIG. 26 depicts an example of an address fault detection system.

FIG. 26 depicts memory system 2600. Memory system 2600 comprises array 1120, address fault detection array 1130, and analog comparator 2610. In this example, address fault detection array 1130 comprises a single column of non-volatile memory or ROM cells that each store a "1" value. The outputs of each of non-volatile memory or ROM cells are coupled in parallel to a single bit line. When a word line is asserted, the corresponding cell in that row will output a "1," which generates a current Ir. A typical value for Ir is 20 μA. If more than one word line is asserted (which will happen when a fault causes the intended word line and an unintended word line to be asserted), then more than one cell in address fault detection array 1130 will output a "1," with the total output current being n*Ir, where n is the number of activated word lines. The output is input into analog comparator 2610. A reference current is also input into analog comparator 2610. An exemplary reference current is 1.3 Ir. If the input from address fault detection array 1130 exceeds 1.3 Ir, then the output of analog comparator 2610 will be a "1," which signifies that more than one word line is activated, which indicates a fault condition. If the input from address fault detection array 1130 is less than 1.31 r, then the output will be a "0," which signifies that one, or zero, word lines are activated, which indicates a non-fault condition. (It is possible that a zero word line situation is a fault; this example will not detect that condition.) It can be understood that other multiples besides 1.3 can be selected.

In some examples where address fault detection array 1130 comprises flash memory cells, a "1" state in a cell is an erased state (having a cell current of Ir) and a "0" state in a cell is a programmed state (having a cell current of around 0 μA). In other examples where address fault detection array 1130 comprises flash memory cells, a "1" in a cell is an erased state and a "0" state in the cell is a state where there is no bitline contact between the cell and the array column.

Figure 27:
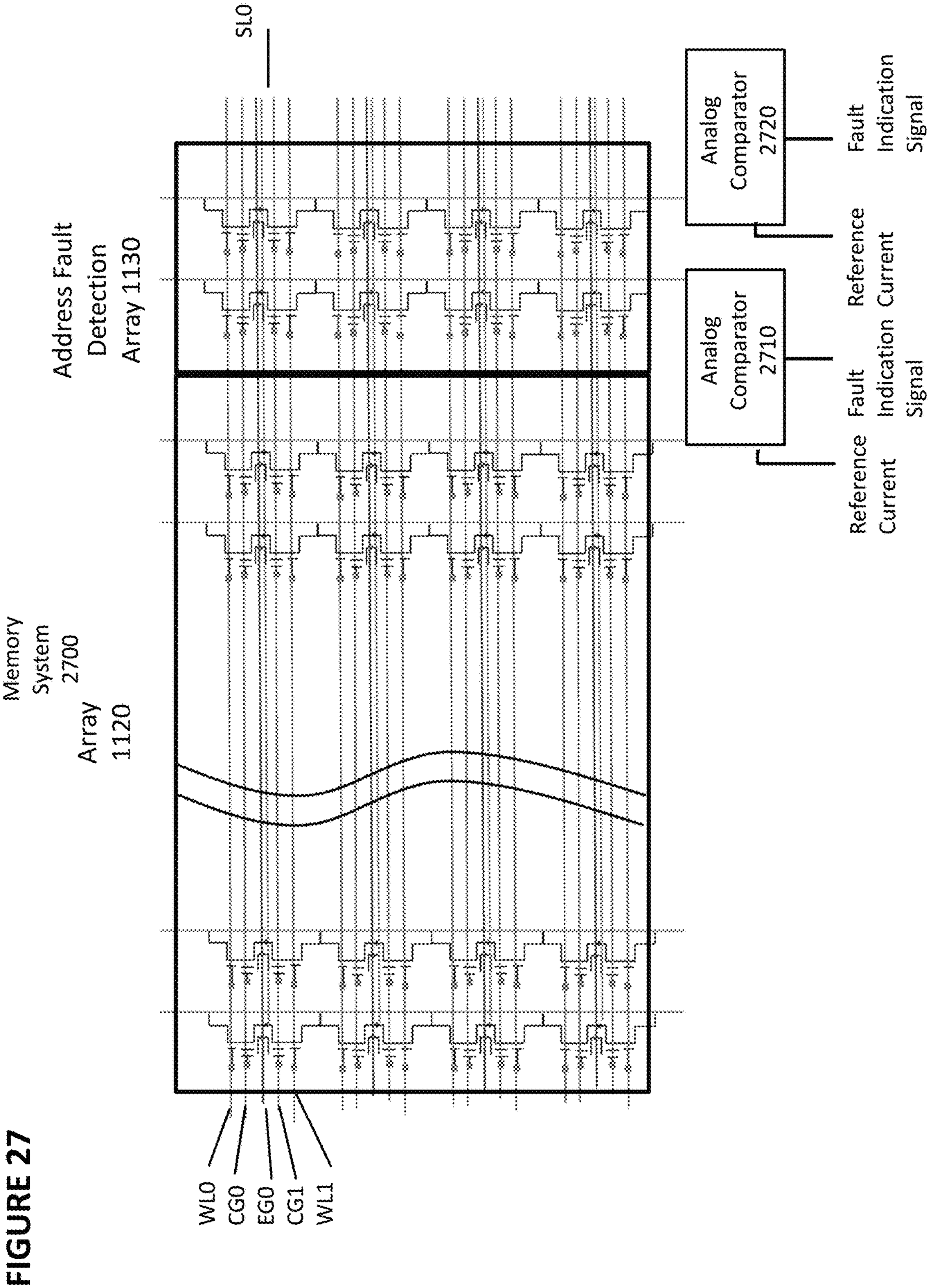
FIG. 27 depicts another example of an address fault detection system.

FIG. 27 depicts memory system 2700. Memory system 2700 is similar to memory system 2600 of FIG. 26 except that it has two columns of cells in address fault detection array 1130. Memory system 2700 comprises array 1120, address fault detection array 1130, and analog comparators 2710 and 2720. In this example, address fault detection array 1130 comprises two columns of non-volatile memory or ROM cells that each store a "1" value. The outputs of each of non-volatile memory or ROM cells in each respective column are coupled in parallel to a single bit line. When a word line is asserted, the corresponding cells in that row each will output a "1," which corresponds to a current Ir. A typical value for Ir is 20 μA. If more than one word line is asserted (which is a type of fault condition), then more than one pair of cells in address fault detection array 1130 will output a "1," with the total output current in each column being n*Ir, where n is the number of activated word lines. The output is input into analog comparators 2710 and 2720. A reference current, such as 0.5 Ir and 1.1 Ir, also are input into analog comparators 2710 and 2720, respectively. If the input from address fault detection array 1130 exceeds 1.1 Ir, then the comparator 2720 output will be a "1," which signifies that more than one word line is activated, which indicates a fault condition. If the input from address fault detection array 1130 exceeds 0.5 Ir, but is less than 1.1 Ir, then the comparator 2710 output will be a "1" and the comparator 2720 output will be a "0," which signifies that exactly one word line is activated, which indicates a non-fault condition. If the input from address fault detection array 1130 is less than 0.5 Ir, then the comparator 2710 output will be a "0," which signifies that no word lines are activated, which indicates a fault condition. It can be understood that other multiples besides 1.1 can be selected in order to determine whether a certain number of wordlines (e.g., 3) are at fault.

Figure 28:
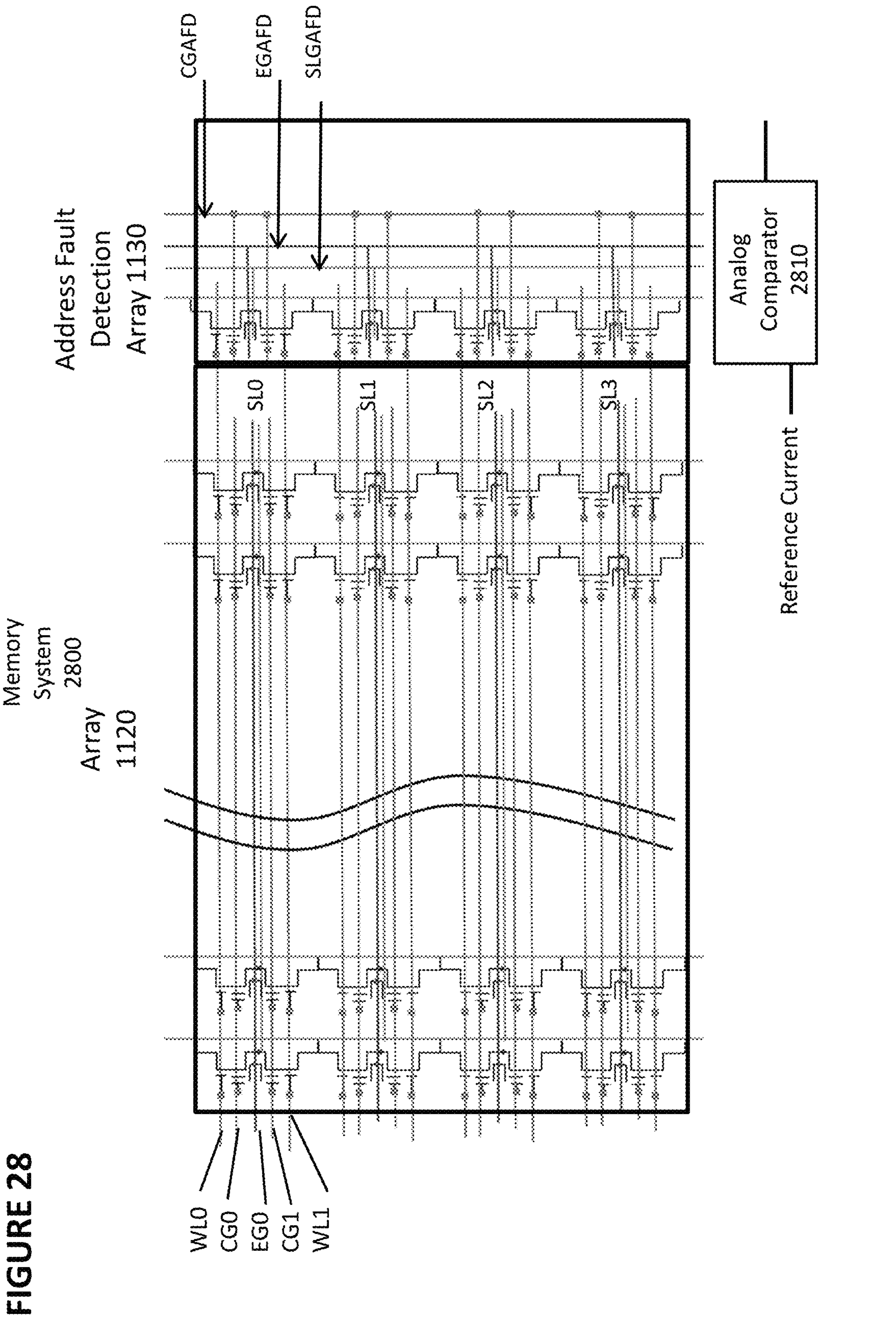
FIG. 28 depicts another example of an address fault detection system.

FIG. 28 depicts memory system 2800. Memory system 2800 comprises array 1120, address fault detection array 1130, and analog comparator 2810. Memory system 2800 is the same as memory system 2600 in FIG. 26, except that address fault detection array 1130 is controlled by its own control gate signal (CGAFD), erase gate signal (EGAFD), and source line gate signal (SLGAFD). As in FIG. 26, array 1120 and address fault detection array 1130 share word lines. Thus, in this example, array 1120 and address fault detection array 1130 share word lines but use separate high voltage control lines such that address fault detection array 1130 can be erased or programmed independently from array 1120.

Figure 29:
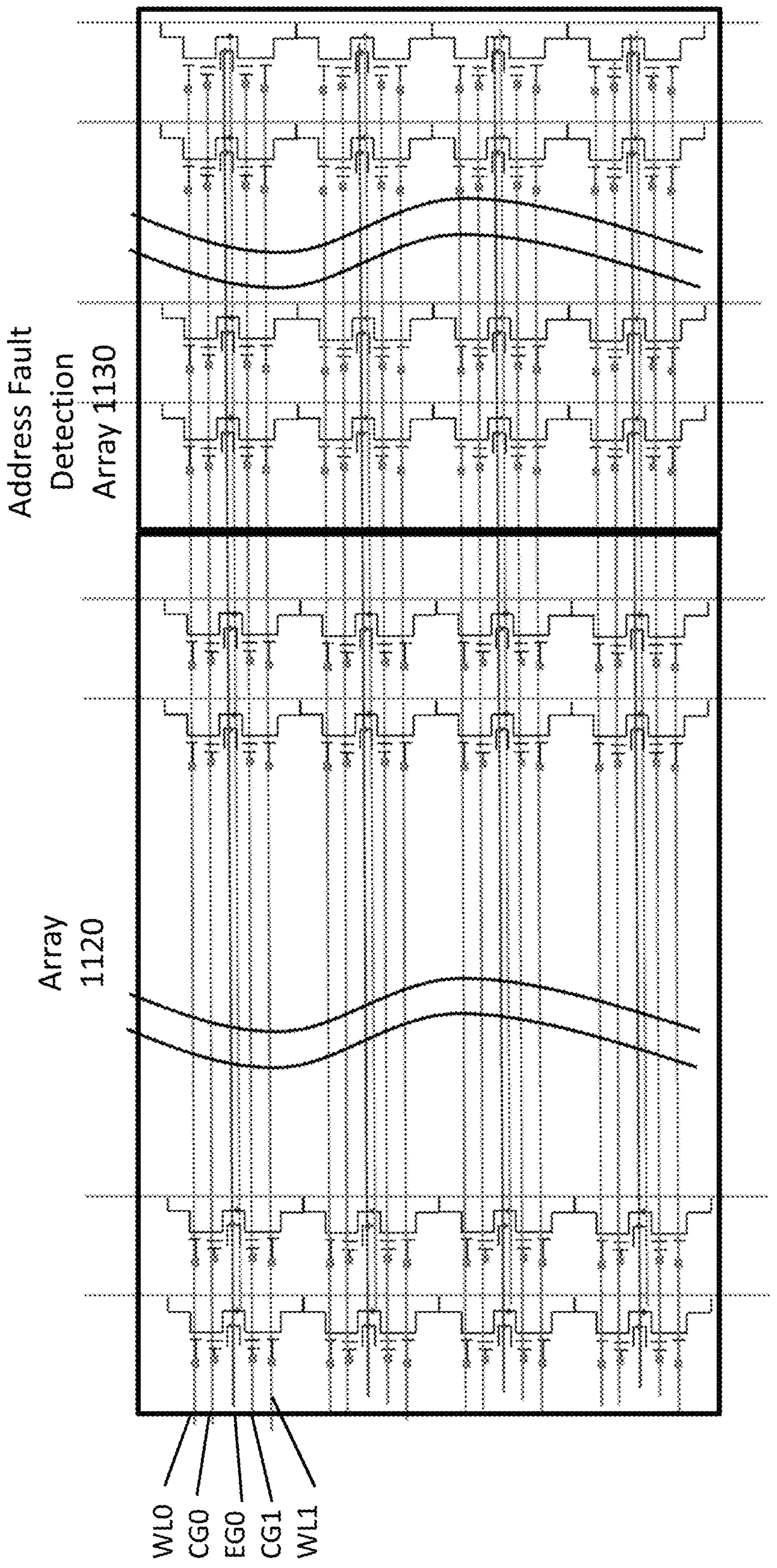
FIG. 29 depicts another example of an address fault detection system.

FIG. 29 depicts memory system 2900. Memory system 2900 comprises array 1120 and address fault detection array 1130. Address fault detection array 1130 comprises one or more columns of non-volatile memory cells. Because array 1120 and address fault detection array 1130 share word lines and high voltage control lines (control gate, erase gate, and source line gate signals), the cells in a particular row of address fault detection array 1130 will be erased when the cells in that same row are erased in array 1120. Therefore, the appropriate values will need to be programmed into each erased row in address fault detection array 1130 by a controller or other device following an erase operation. Certain columns in address fault detection array 1130 contain the encoded validation bits for the row portion and/or column of each possible address, using the encoding schemes of FIG. 12, 13A, 13B, 14, 18, 23, 24A, 24B, 25A, or 25B, or another encoding scheme.

Figure 30:
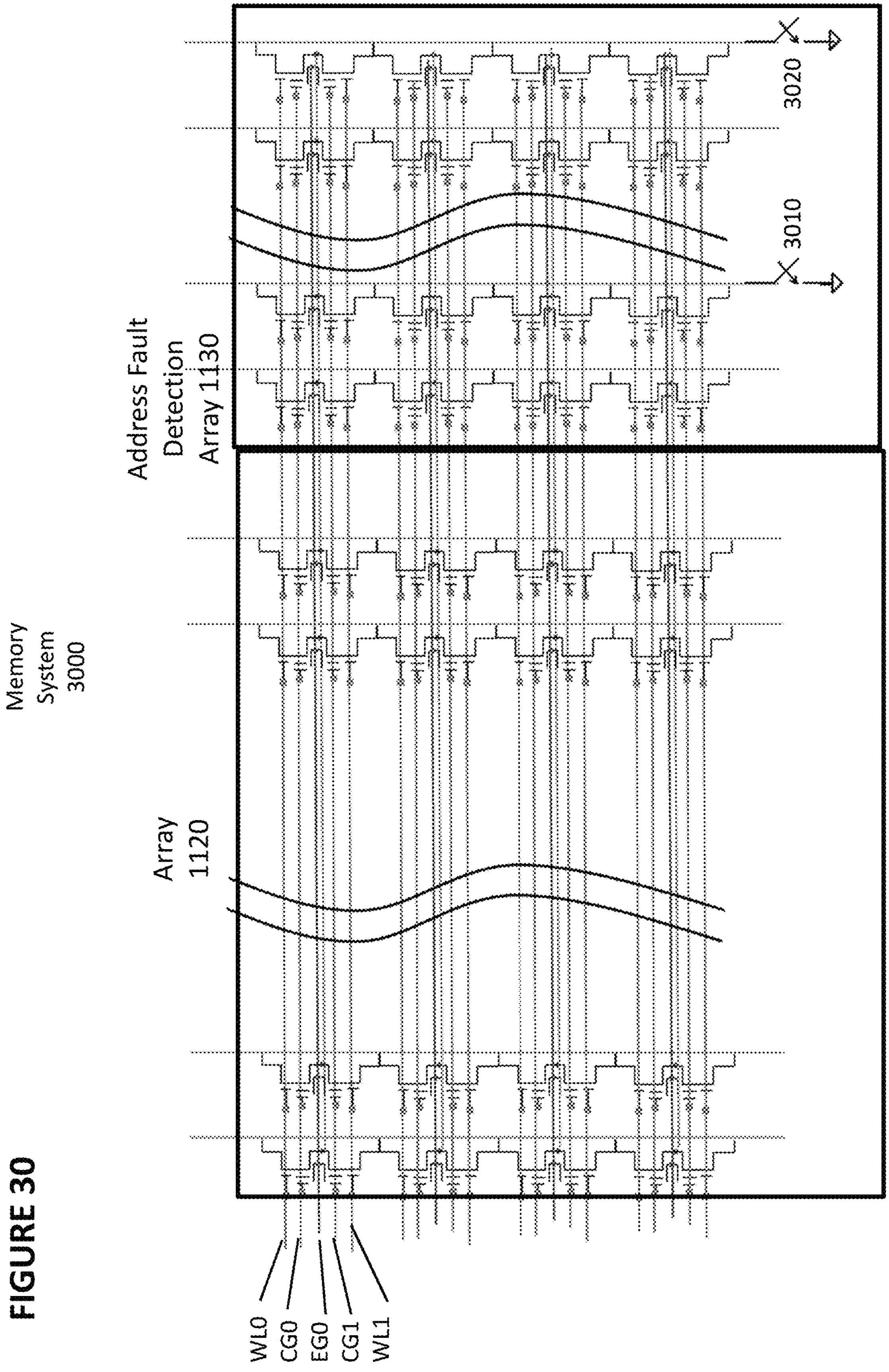
FIG. 30 depicts another example of an address fault detection system.

FIG. 30 depicts memory system 3000. Memory system 3000 comprises array 1120 and address fault detection array 1130. Address fault detection array 1130 comprises one or more columns of non-volatile memory cells. Memory system 3000 is identical to memory system 2900 except that memory system 3000 comprises circuits 3010 and 3020, which pull down one or more bit lines to ground during an operation. This is used for example to pull down the local source line to ground more strongly due to multiple cells and be on at the same time locally in the ROM (address fault detection array 1130) pattern. It is to be understood that memory system 3000 can comprise one such circuit for each column in address fault detection array 1130. Certain columns in address fault detection array 1130 contain the encoded validation bits for the row portion and/or column of each possible address, using the encoding schemes of FIG. 12, 13A, 13B, 14, 18, 23, 24A, 24B, 25A, or 25B, or another encoding scheme.

Figure 31:
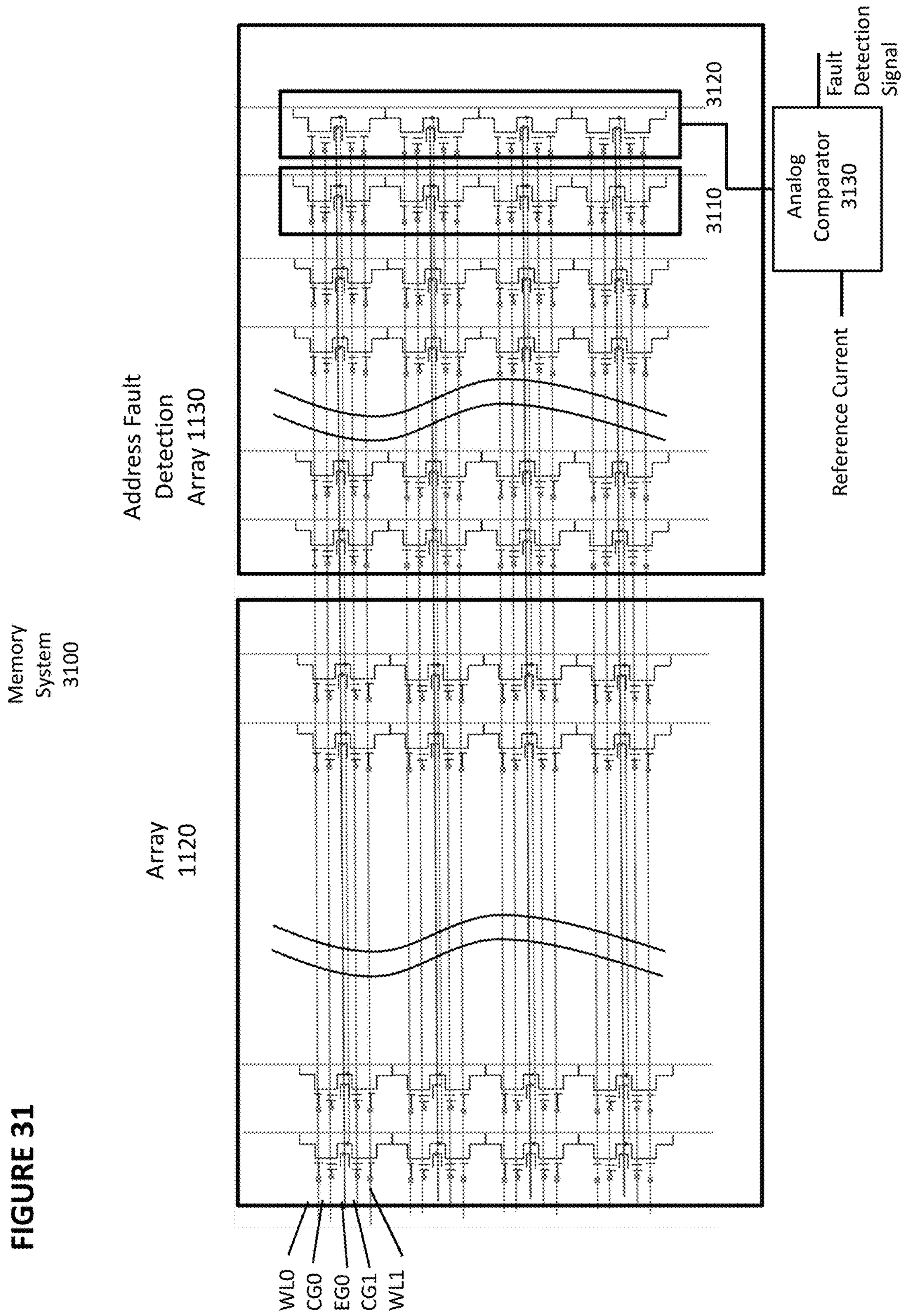
FIG. 31 depicts another example of an address fault detection system.

FIG. 31 depicts memory system 3100. Memory system 3100 comprises array 1120, address fault detection array 1130, and analog comparator 3130. Address fault detection array 1130 comprises one or more columns of non-volatile memory cells. Memory system 3100 is identical to memory system 3000 except that memory system 3100 comprises polarity column 3110 and multiple row detection column 3120. Polarity column 3110 contains a single bit for each row to perform the function of the PB bit in FIG. 13A or 13B. Multiple row detection column 3120 contains a single cell for each row, where each single cell in multiple row detection column 3120 stores a "1." This column implements the functionality described previously as to FIG. 26. Other columns in address fault detection array 1130 contain the encoded validation bits for the row portion and/or column of each possible address, using the encoding schemes of FIG. 12, 13A, 13B, 14, 18, 23, 24A, 24B, 25A, or 25B, or another encoding scheme.

In all of the examples described herein, when a fault is indicated, the memory system can take appropriate steps. For instance, the memory system can ignore the results of any read operation that was impacted by the fault and can repeat the read operation. The memory system also can repeat any write operation that was impacted by a fault. In the situation where array 1120 comprises flash memory cells, memory system can first erase the relevant portion of the array before repeating the write (program) operation.

Figure 32:
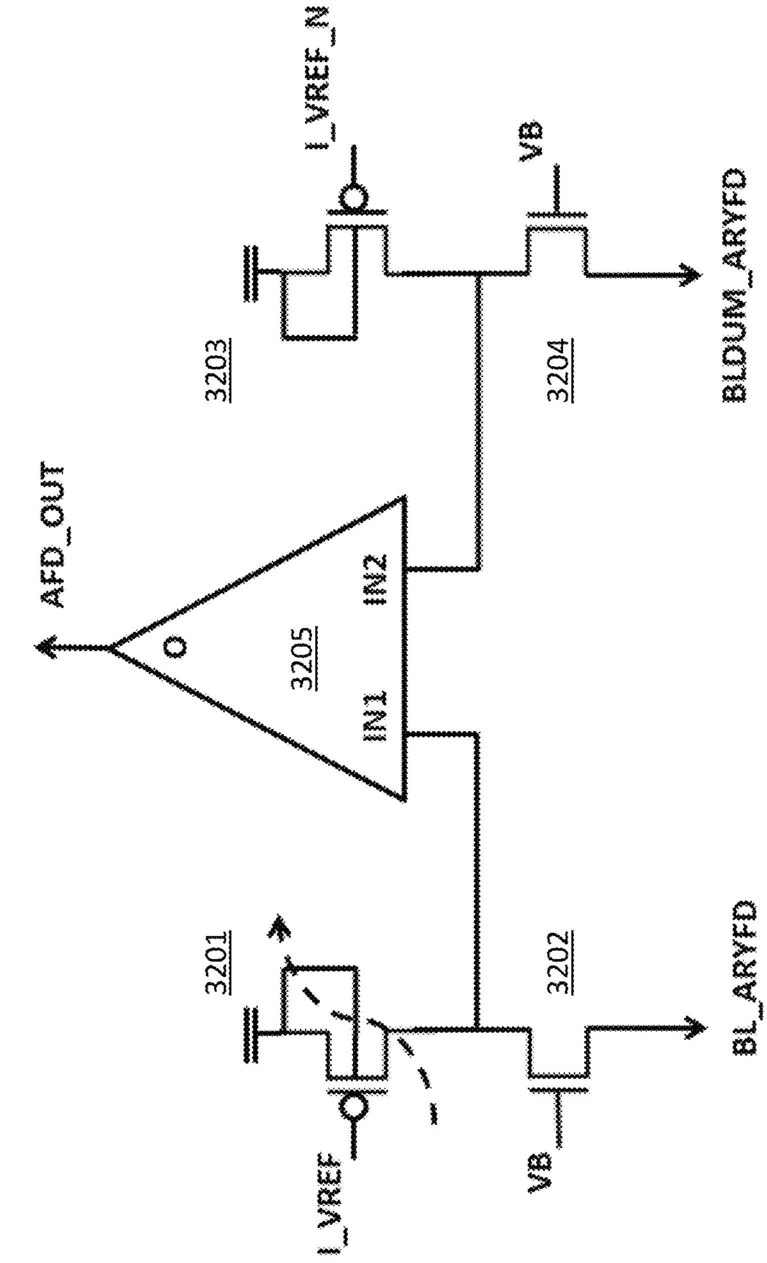
FIG. 32 depicts an example of a sense circuit for use in the examples of an address fault detection system.

FIG. 32 depicts an example of a sensing circuit. Sensing circuit 3200 comprises bias transistors 3202 and 3204, current source (reference current) transistors 3201 and 3203, and analog comparator 3205. Bias transistor 3202 connects to a bit line (column) in address fault detection array 1130. Bias transistor 3203 connects to a dummy bit line, to balance capacitance, or to a reference current generator.

Different configurations can be selected by choosing the appropriate transistors for current source transistors 3201 and 3203. In one configuration, the output of comparator 3205 will indicate if one word line is asserted or not. For example, current source (reference current) transistor 3201 may be selected, or set, to generate a current equal to 0.5*IR, where IR is the current drawn by a single cell when the word line is asserted. In this configuration, and output of "0" from comparator 3205 indicates no word lines are asserted, and an output of "1" indicates one word line is asserted.

In another configuration, the output of comparator 3205 will indicate if more than one word line is asserted or not. Current source transistors 3201 and 3203 are selected, or set, to generate a current equal to 1.1*IR, where IR is the current drawn by a single cell when the word line is asserted. In this configuration, and output of "0" from comparator 3205 indicates one word line or fewer are asserted, indicates that more than one word line is asserted.

Figure 33:
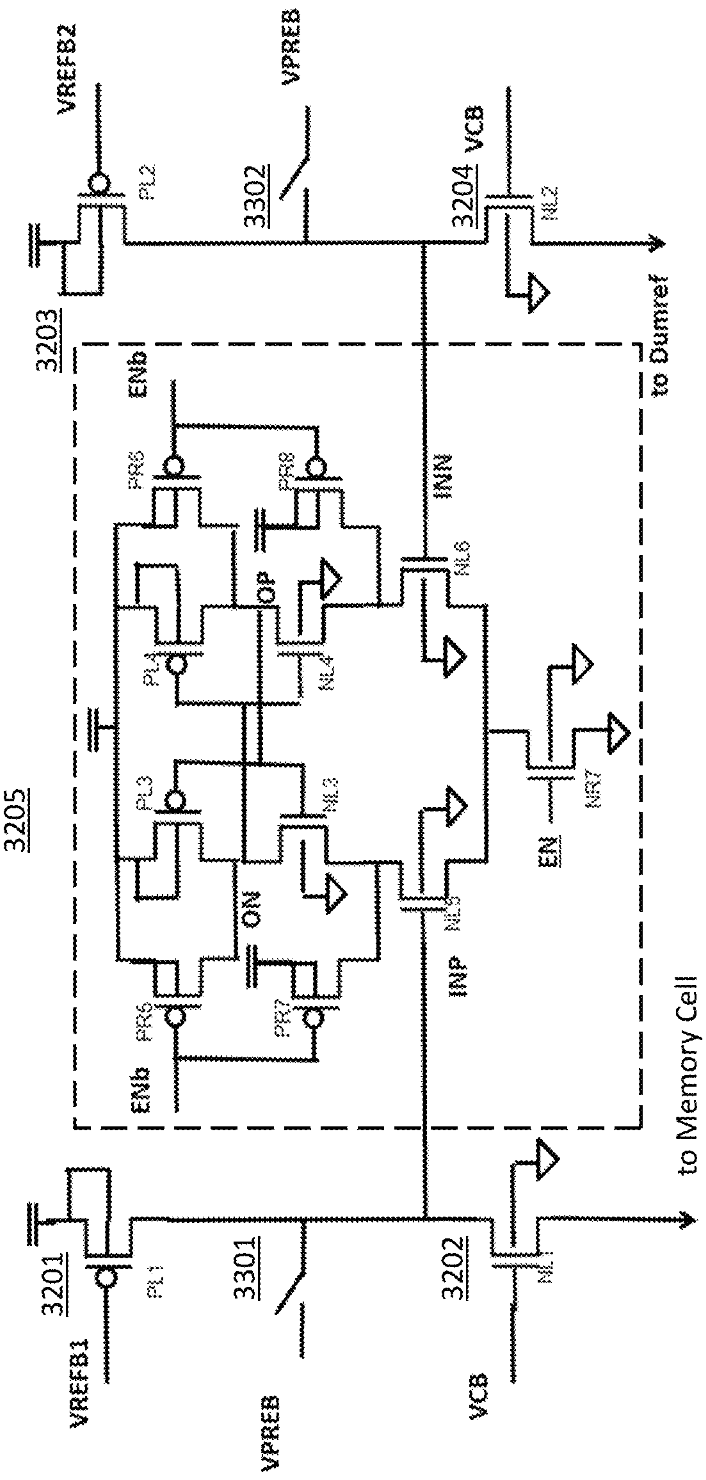
FIG. 33 depicts an example of a comparator used in the sense circuit of FIG. 32.

FIG. 33 depicts additional detail of sensing circuit 3200. Bias switches 3301 and 3302 also are depicted.

Figure 34:
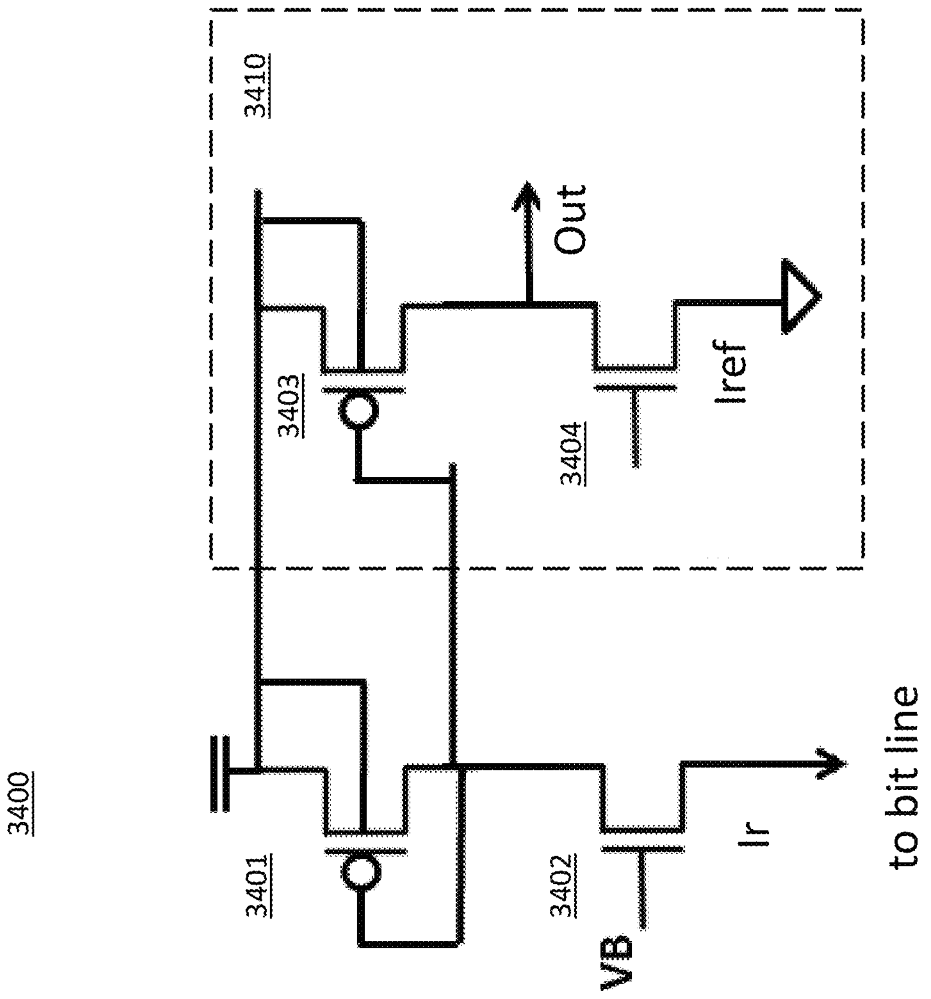
FIG. 34 depicts another example of a sense circuit for use in the examples of an address fault detection system.

FIG. 34 depicts another example of a sensing circuit. Sensing circuit 3400 comprises bias transistors 3402 and 3404 and current mirror transistors 3401 and 3403. The transistor 3403 and 3404 constitutes output comparison stage 3410. Bias transistor 3402 connects to a bit line (column) in address fault detection array 1130. Bias transistor 3404 connects to ground, or other common potential. The mirror transistor 3403 mirrors the cell current (Ir) from the bit line in address fault detection array 1130 though the mirror transistor 3401 to be compared versus the reference current, Iref, from the bias transistor 3404. The bias transistor 3404 is varied (e.g., trimmable size) to implement different current comparison ratio (%*Ir). The output (Out) will indicate whether a "1" or "0" is being output on that bit line from address fault detection array 1130. Specifically, if cell current Ir>Iref (indicating a relatively high memory cell current, indicative of a "0" being stored in the cell), then Out will be "1", and if cell current Ir<Iref (indicating a relatively low memory cell current, indicative of a "1" being stored in the cell), then Out will be "0". There could be multiple blocks of the output comparison stage 3410 to implement different current comparison ratios at the same time with multiple outputs indicating different current sensing ratios. Further the transistor 3403 can be varied (e.g., trimmable size) to implement different mirror ratios from the transistor 3401 into the transistor 3403.

Figure 35:
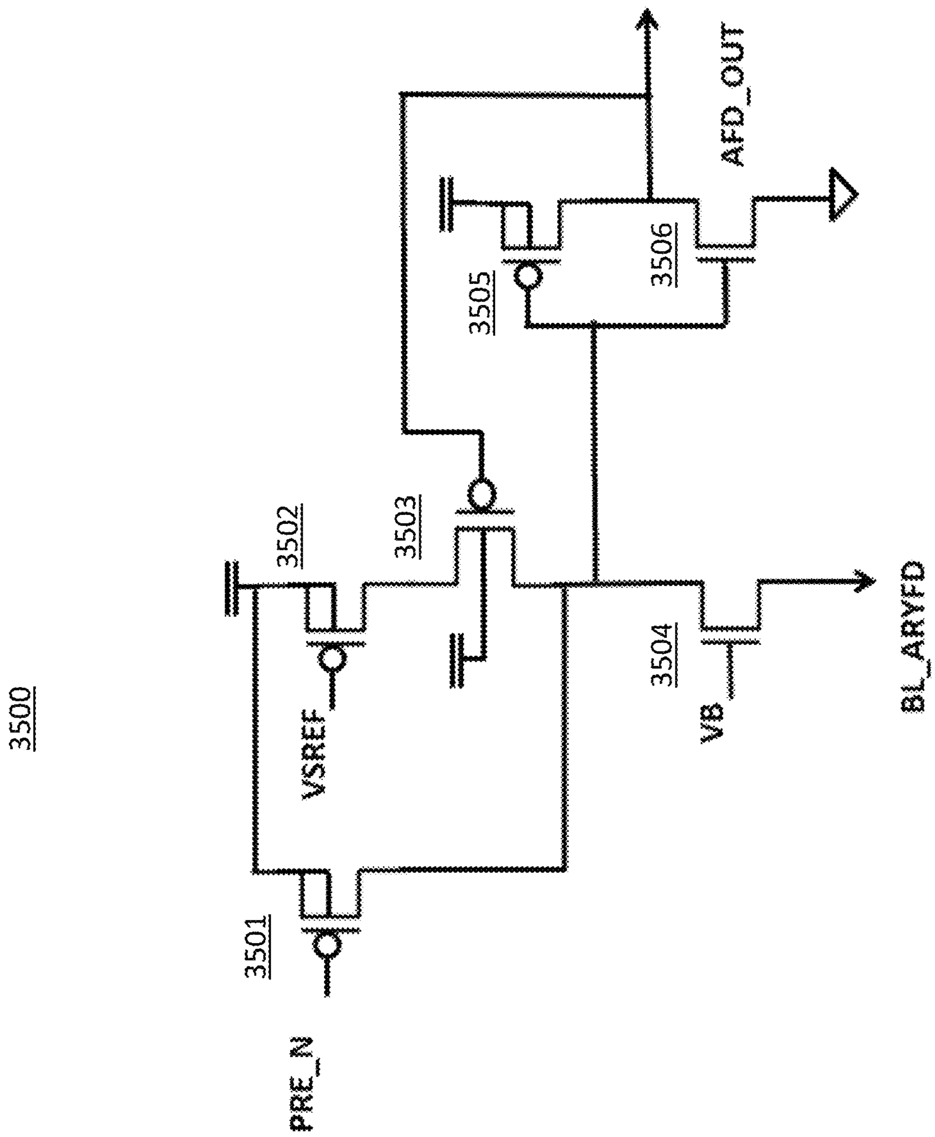
FIG. 35 depicts another example of a sense circuit for use in the examples of an address fault detection system.

FIG. 35 depicts another example of a sensing circuit. Sensing circuit 3500 comprises bias transistors 3504 and 3502, control transistors 3501 and 3503, and an inverter formed of transistors 3505 and 3506. Bias transistor 3504 connects to a bit line (column) in address fault detection array 1130. Bias transistor 3506 connects to ground. The output at AFD_OUT will indicate whether a "1" or "0" is being output on that bit line from address fault detection array 1130. The control transistor 3503 serves to cut off the current in the transistor 3502 and 3504 once the sensing is completed (output of the inverter switches from '0' to '1', meaning gate of transistor 3503 is off). The bias transistor 3502 is used to set up a reference current to be compared versus the cell current (Ir) coupled to the transistor 3504.

Figure 36:
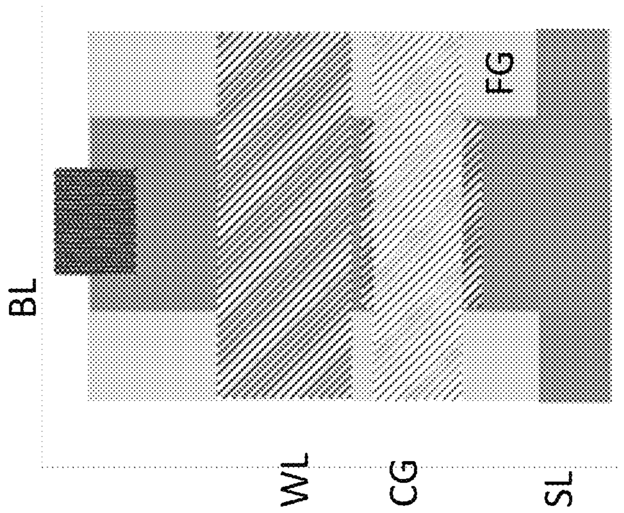
FIG. 36 depicts a layout of a flash memory cell for use in the examples.

FIG. 36 depicts a layout for a non-volatile memory cell 3600 that can be used in address fault detection array 1130. Memory cell 3600 follows the architecture of memory cell 10 in FIG. 1.

Figure 37:
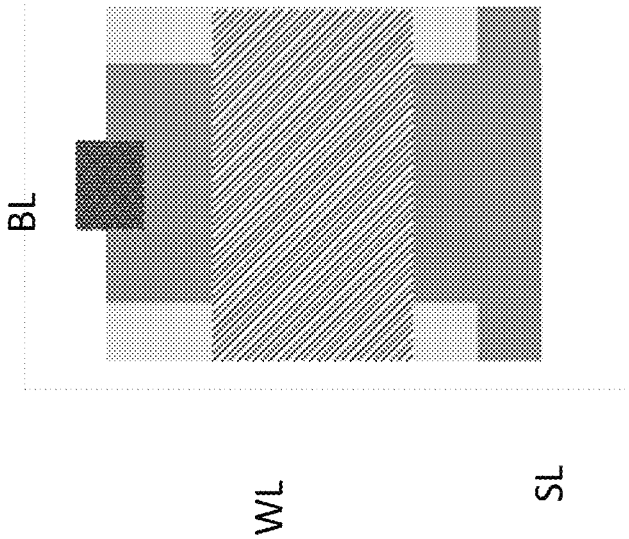
FIG. 37 depicts a layout of a flash memory cell configured as a ROM cell for use in the examples.

FIG. 37 depicts a layout for ROM cell 3700 that can be used in address fault detection array 1130. ROM memory cell 3700 follows the architecture of memory cell 10 in FIG. 1 but is modified to operate as a ROM cell, for example from cell 3600, CG and EG gates can be removed.

Figure 38:
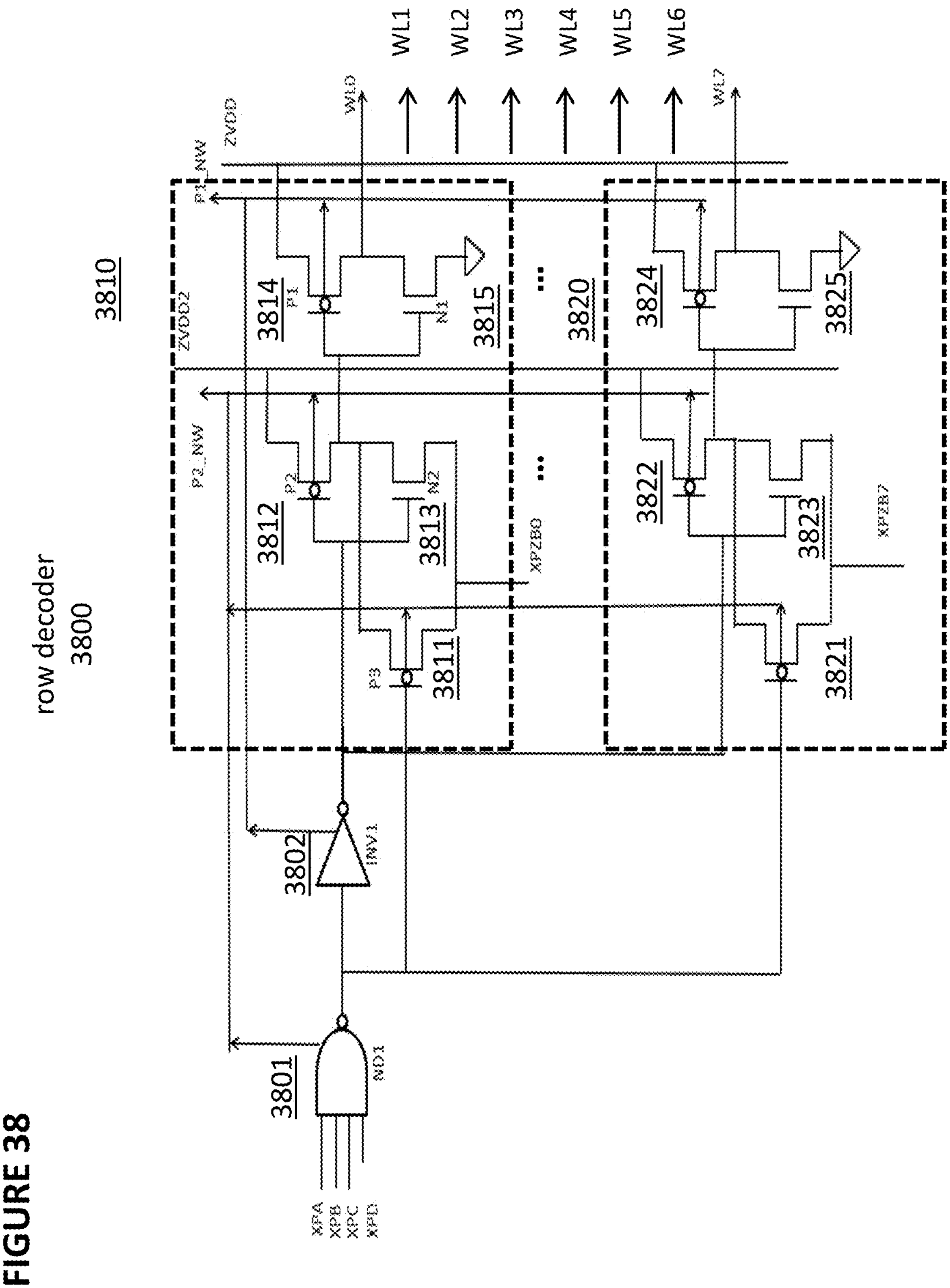
FIG. 38 depicts an example of a row decoder for use with the examples of an address fault detection system.

FIG. 38 depicts row decoder 3800 for 8-word lines in a sector within a memory array (such as memory array 1001, 1002, 1003, and 1004). Row decoder 3800 can be used for row decoder 1110 in the examples described above. Row decoder 3800 comprises NAND gate 3801, which receives pre-decoded address signals, here shown as lines XPA, XPB, XPC, and XPD, which select a sector within a memory array. When XPA, XPB XPC, and XPD are all "high," then the output of NAND gate 3801 will be "low" and this particular sector will be selected.

Row decoder 3800 further comprises inverter 3802, decoder circuit 3810 to generate word line WL0, decoder circuit 3820 to generate WL7, as well as additional decoder circuits (not shown) to generate word lines WL1, WL2, WL3, WL4, WL5, and WL6.

Decoder circuit 3810 comprises PMOS transistors 3811, 3812, and 3814 and NMOS transistors 3813 and 3815, configured as shown. Decoder circuit 3810 receives the output of NAND gate 3801, the output of inverter 3802, and pre-decoded address signal XPZB0, from a previous level of decoding. When this particular sector is selected and XPZB0 is "low," then WL0 will be asserted. When XPZB0 is "high," then WL0 will not be asserted.

Similarly, decoder circuit 3820 comprises PMOS transistors 3821, 3822, and 3824 and NMOS transistors 3823 and 3825, configured as shown. Decoder circuit 3820 receives the output of NAND gate 3801, the output of inverter 3802, and pre-decoded address signal XPZB7. When this particular sector is selected and XPZB7 is "low," then WL7 will be asserted. When XPZB7 is "high," then WL7 will not be asserted.

It is to be understood that the decoder circuits (not shown) for WL1, WL2, and WL3, WL4, WL5, and WL6 will follow the same design as decoder circuits 3810 and 3820 except that they will receive the inputs XPZB1, XPZB2, XPZB3, XPZB4, XPZB5, and XPZB6, respectively, instead of XPZB0 or XPZB7.

In the situation where this sector is selected and it is desired for WL0 to be asserted, the output of NAND gate 3801 will be "low," and the output of inverter will be "high." PMOS transistor 3811 will be turned on, and the node between PMOS transistor 3812 and NMOS transistor 3813 will receive the value of XPZB0, which will be "low" when word line WL0 is to be asserted. This will turn on PMOS transistor 3814, which will pull WL0 "high" to ZVDD which indicates an asserted state. In this instance, XPZB7 is "high," signifying that WL7 is not to be asserted, which will pull the node between PMOS transistor 3822 and NMOS transistor 3823 to the value of XPZB7 (which is "high"), which will turn on NMOS transistor 3825 and cause WL to be "low," which indicates a non-asserted state. In this manner, one of the word lines WL0 . . . WL7 can be selected when this sector is selected.

Figure 39:
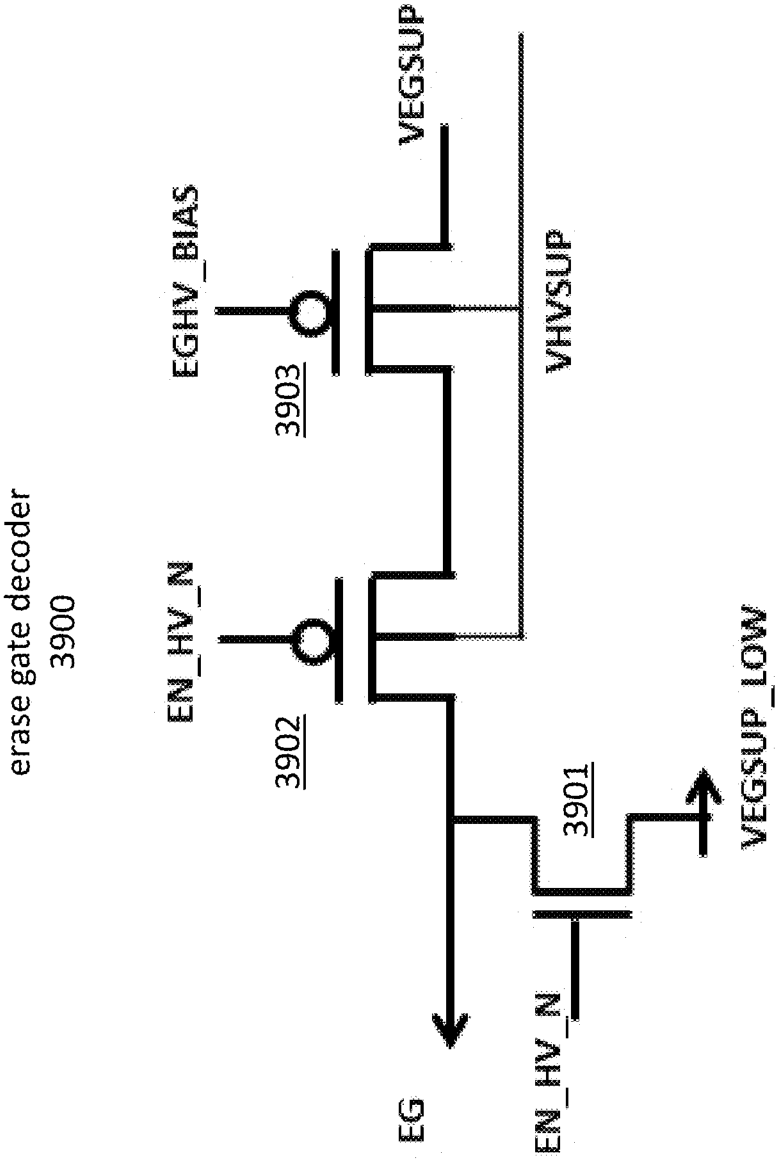
FIG. 39 depicts an example of an erase gate decoder for use with the examples of an address fault detection system.

FIG. 39 shows erase gate decoder 3900 as part of the high voltage decoders 1018-1021. Erase gate decoder 3900 comprises NMOS transistor 3901 and PMOS transistors 3902 and 3903, configured as shown. PMOS transistor 3903 is a current limiter with EGHV_BIAS as a current mirror bias level. When this erase gate signal (EG) is to be asserted, EN_HV_N will be set to low (e.g., 0V or 1.2V or 2.5V), which will turn on PMOS transistor 3902 and turn off NMOS transistor 3901, which will cause erase gate (EG) to be high (i.e. =VEGSUP, for example 11.5V). When this erase gate signal (EG) is to be not asserted, EN_HV_N will be set to high, which will turn off PMOS transistor 3902 and turn on NMOS transistor 3901, which will cause erase gate (EG) to be low (i.e., =VEGSUP LOW level, for example 0v or 1.2V or 2.5V).

Figure 40:
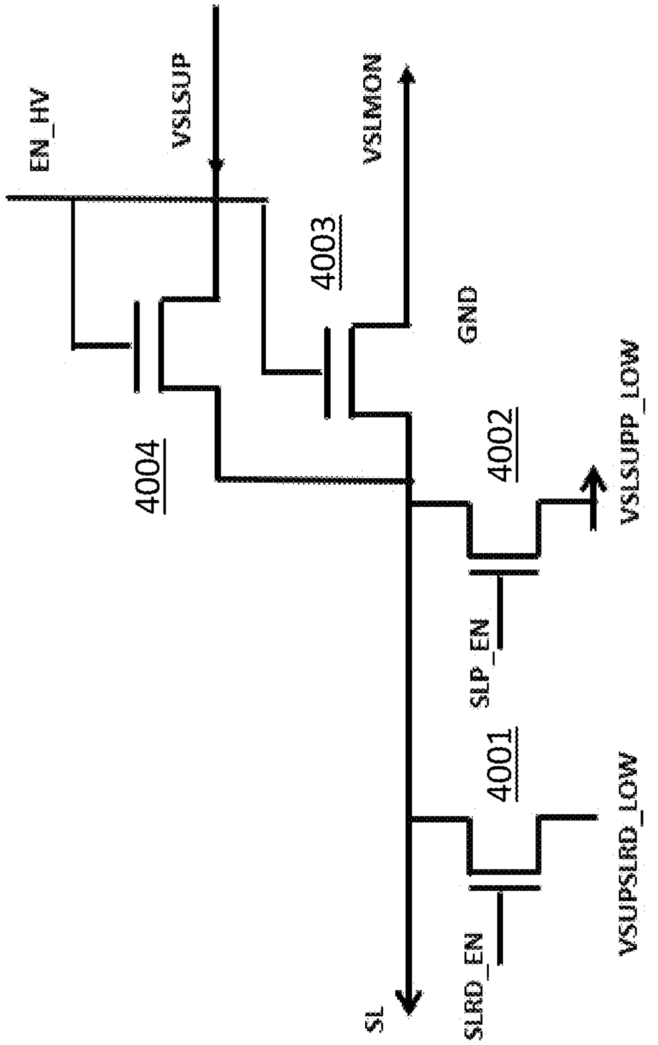
FIG. 40 depicts an example of a source line decoder for use with the examples of an address fault detection system.

FIG. 40 shows source line decoder 4000 as part of high voltage decoders 1018-1021. Source line decoder 4000 comprises NMOS transistors 4001, 4002, 4003, and 4004, configured as shown. NMOS transistor 4001 pulls the source line (SL) low during a read operation in response to an active high SLRD_EN signal. NMOS transistor 4002 pulls the source line (SL) low during a programming operation in response to an active high SLP_EN signal. NMOS transistor 4003 performs a monitoring function, through output VSLMON, i.e. it provides the voltage on SL to be detected on output VSLMON. NMOS transistor 4004 provides a voltage to source line (SL) in response to an active high EN_HV signal.

Figure 41:
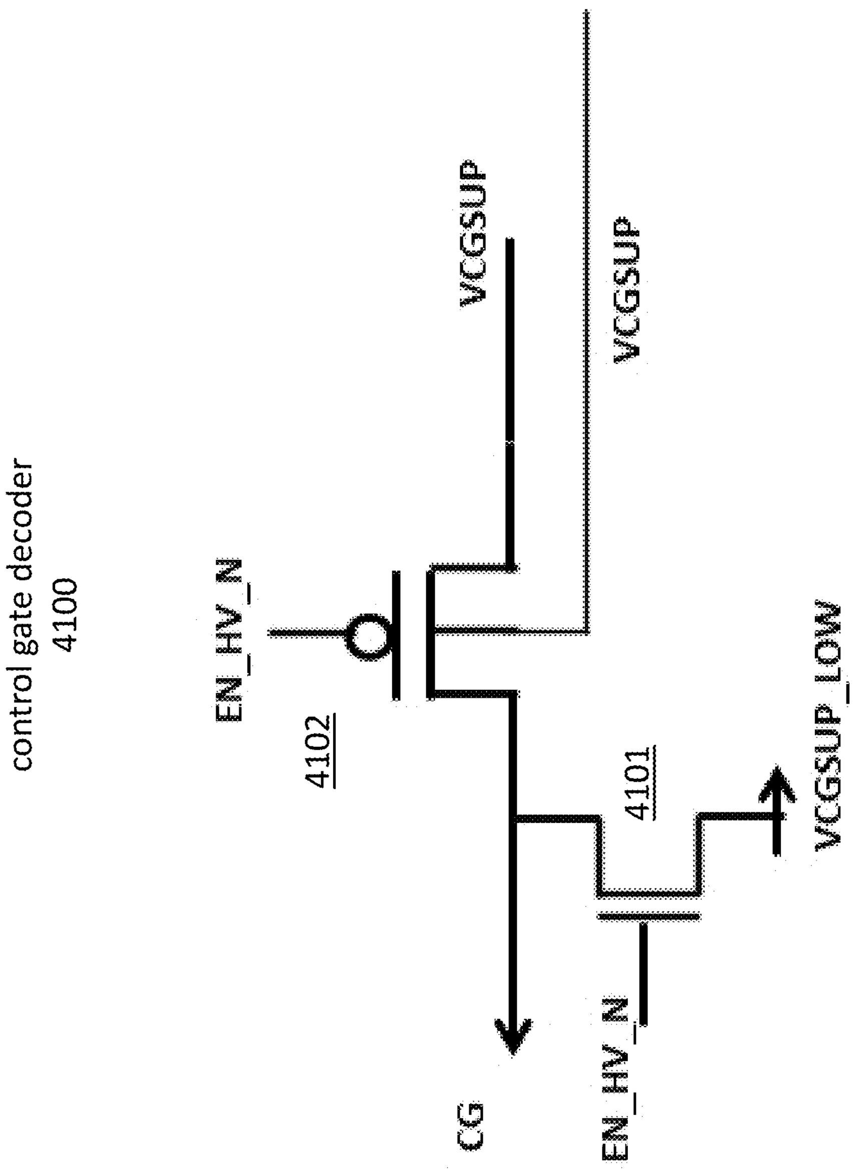
FIG. 41 depicts an example of a control gate decoder for use with the examples of an address fault detection system.

FIG. 41 depicts control gate decoder 4100 as part of high voltage decoders 1018-1021. Control gate decoder 4100 comprises NMOS transistor 4101 and PMOS transistor 4102. NMOS transistor 4101 will pull down the control gate signal (CG) in response to an active high signal EN_HV_N. PMOS transistor 4102 will pull up the control gate signal (CG) in response to an active low signal EN_HV_N.

Figure 42:
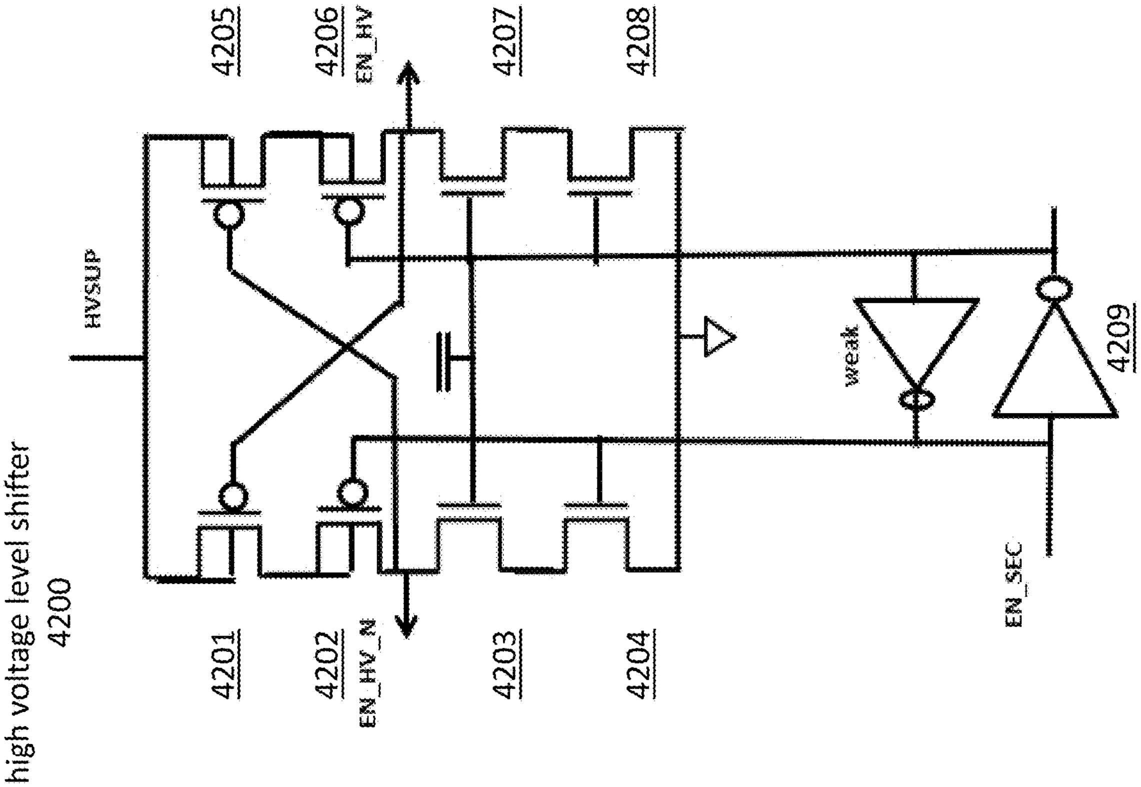
FIG. 42 depicts an example of a high voltage level shifter use with the examples of an address fault detection system.

FIG. 42 depicts latch voltage shifter 4200 as part of high voltage decoders 1018-1021. Latch voltage shifter 4200 comprises low voltage latch inverter 4209, NMOS transistors 4203, 4204, 4207, and 4208, and PMOS transistors 4201, 4202, 4205, and 4206, in the configuration shown. Latch voltage shifter 4200 receives signal EN_SEC as an input and outputs EN_HV and EN_HV_N, which have a larger voltage swing than the swing of EN_SEC.

What is claimed is:

1. A memory system, comprising:

a memory array comprising a first set of memory cells arranged in rows and columns;

a row decoder configured to receive one of M row addresses as an input, the row decoder coupled to a plurality of word lines, wherein each of the M row addresses corresponds to a word line in the plurality of word lines and wherein each word line is coupled to a row of cells in the first set of memory cells; and an address fault detection array comprising a second set of memory cells arranged in rows and columns, wherein each of the plurality of word lines is coupled to a row of cells in the second set of memory cells containing an N-bit encoded word such that each of the M row addresses corresponds to an N-bit encoded word where N is an integer and each N-bit encoded word comprises:

one or more K-bit groups; and one or more L-bit groups;

wherein each of the K-bit and L-bit groups contain only one "1" bit, K and L are integers, K≤N, L≤N, K>2, L>2, and the sum of the number of bits in the one or more K-bit groups and the one or more L-bit groups is N, and wherein the same K-bit groups and L-bit groups are applied to each of the N-bit encoded words.

2. The memory system of claim 1, further comprising:

a comparator to identify an address fault based on the row address and an output of the address fault detection array.

3. The memory system of claim 2, wherein the comparator indicates a fault if no row has been selected.

4. The memory system of claim 2, wherein the comparator indicates a fault if two or more rows of the memory array have been selected.

5. The memory system of claim 2, wherein the comparator comprises an analog comparator.

6. The memory system of claim 1, wherein each cell in the first set of memory cells is a split gate flash memory cell.

7. The memory system of claim 1, wherein each cell in the second set of memory cells is a split gate flash memory cell.

8. The memory system of claim 1, wherein each cell in the second set of memory cells is a read only memory cell.

9. The memory system of claim 1, wherein each cell in the first set of memory cells is an analog memory cell.

10. The memory system of claim 1, further comprising:

a multi-state sense amplifier to sense the memory array.

11. The memory system of claim 1, wherein the memory cells in the second set of memory cells are multi-state memory cells.

12. The memory system of claim 11 wherein the first memory cells are analog memory cells.

13. The memory system of claim 11, wherein each first memory cell is a split gate flash memory cell.

14. The memory system of claim 11, wherein each second memory cell is a split gate flash memory cell.

15. The memory system of claim 11, wherein each second memory cell is a read only memory cell.

16. The memory system of claim 11, further comprising:

a multi-state sense amplifier to sense the address fault detection array.

* * * * *